(12) United States Patent
Lee et al.

(10) Patent No.: US 10,763,281 B2
(45) Date of Patent: Sep. 1, 2020

(54) SEMICONDUCTOR DEVICE AND METHOD OF MANUFACTURING THE SAME

(71) Applicant: Samsung Display Co., Ltd., Yongin-Si, Gyeonggi-Do (KR)

(72) Inventors: Sunhee Lee, Seoul (KR); Seryeong Kim, Pyeongtaek-si (KR); Eunhyun Kim, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 58 days.

(21) Appl. No.: 15/654,005

(22) Filed: Jul. 19, 2017

(65) Prior Publication Data

US 2018/0040639 A1 Feb. 8, 2018

(30) Foreign Application Priority Data

Aug. 3, 2016 (KR) .......... 10-2016-0099170

(51) Int. Cl.
*H01L 27/12* (2006.01)
*H01L 27/32* (2006.01)

(52) U.S. Cl.
CPC ........ *H01L 27/1225* (2013.01); *H01L 27/127* (2013.01); *H01L 27/1229* (2013.01);
(Continued)

(58) Field of Classification Search
CPC ............. H01L 27/1229; H01L 27/1225; H01L 27/1222; H01L 27/3258; H01L 27/3248; H01L 27/3272
See application file for complete search history.

(56) References Cited

U.S. PATENT DOCUMENTS

2003/0025127 A1* 2/2003 Yanai .................. H01L 27/12
257/158
2014/0042438 A1 2/2014 Yamazaki
(Continued)

FOREIGN PATENT DOCUMENTS

KR 1020130089595 A 8/2013
KR 101424870 B1 7/2014
(Continued)

OTHER PUBLICATIONS

Tsubuku, et al., "Negative-Bias Photodegradation Mechanism in InGaZnO TFT", 16-1, SID 2013 Digest, pp. 166-169.
(Continued)

*Primary Examiner* — Thanhha S Pham
(74) *Attorney, Agent, or Firm* — Cantor Colburn LLP

(57) ABSTRACT

A semiconductor device includes a base substrate, a first thin film transistor disposed on the base substrate, a second thin film transistor disposed on the base substrate, and a plurality of insulating layers disposed on the base substrate. The first thin film transistor includes a first input electrode, a first output electrode, a first control electrode, and a first oxide semiconductor pattern, which are disposed on the base substrate. The second thin film transistor includes a second input electrode, a second output electrode, a second control electrode, and a second oxide semiconductor pattern, which are disposed on the base substrate. The first oxide semiconductor pattern includes a crystalline oxide semiconductor, and the second oxide semiconductor pattern includes an oxide semiconductor having a crystal structure different from a crystal structure of the first oxide semiconductor pattern.

16 Claims, 18 Drawing Sheets

(52) U.S. Cl.
CPC ...... *H01L 27/1237* (2013.01); *H01L 27/3248* (2013.01); *H01L 27/3258* (2013.01); *H01L 27/3272* (2013.01); *H01L 2227/323* (2013.01)

(56) References Cited

U.S. PATENT DOCUMENTS

| | | | |
|---|---|---|---|
| 2018/0047830 A1* | 2/2018 | Lu | H01L 29/786 |
| 2018/0268759 A1* | 9/2018 | Wang | G09G 3/32 |
| 2018/0277574 A1* | 9/2018 | Ochi | H01L 29/7869 |

FOREIGN PATENT DOCUMENTS

| | | |
|---|---|---|
| KR | 1020150063177 A | 6/2015 |
| KR | 1020150093616 A | 8/2015 |
| KR | 1020160006870 A | 1/2016 |

OTHER PUBLICATIONS

Yamazaki, Shunpei, "A Possibility of Crystalline Indium-Gallium-Zinc-Oxide", 5th Asia Symposium on Quality Electronic Design, 2013 IEEE, pp. 1-5.

\* cited by examiner

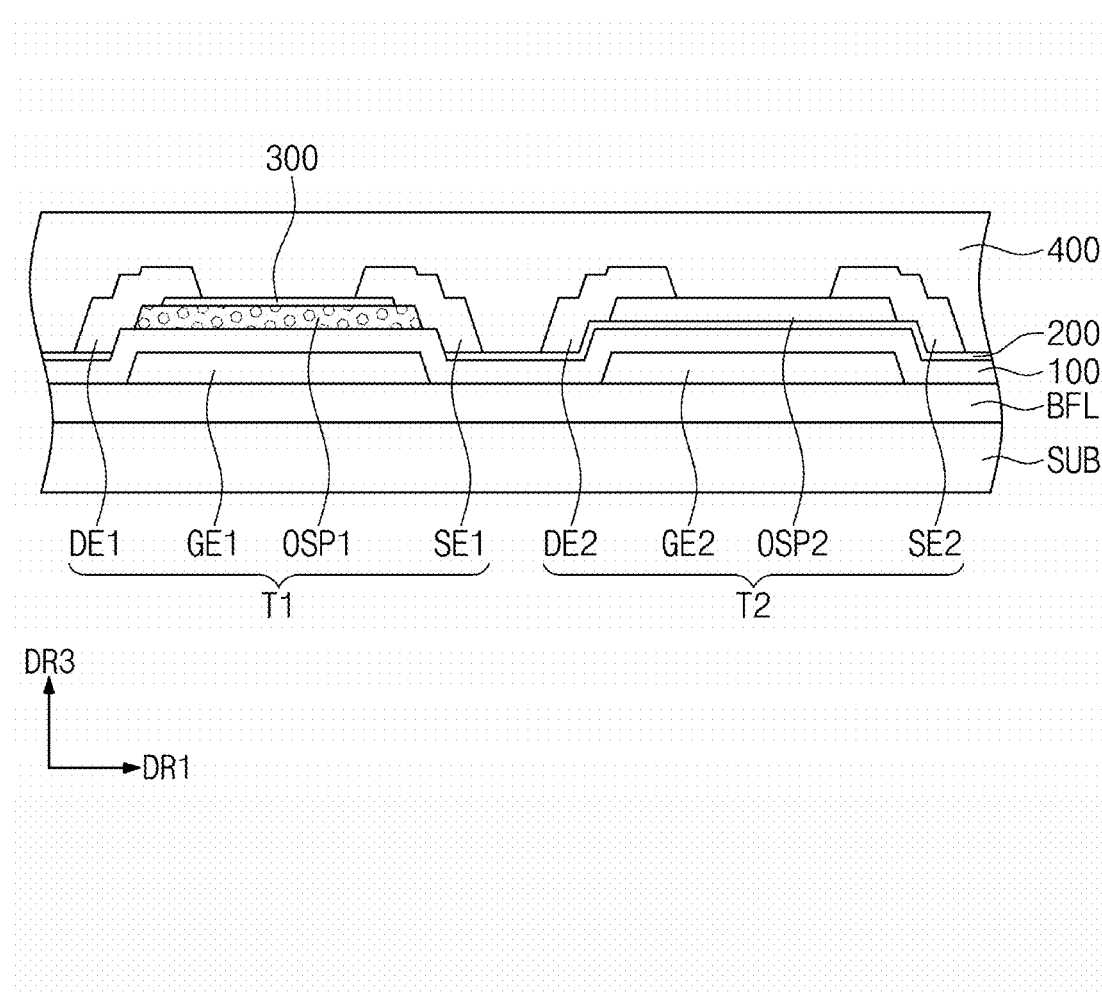

SEMICONDUCTOR DEVICE AND METHOD OF MANUFACTURING THE SAME

This application claims priority to Korean Patent Application No. 10-2016-0099170, filed on Aug. 3, 2016, and all the benefits accruing therefrom under 35 U.S.C. § 119, the content of which in its entirety is herein incorporated by reference.

BACKGROUND

1. Field

The disclosure relates to a semiconductor device and a method of manufacturing the semiconductor device. More particularly, the disclosure relates to a semiconductor device including a plurality of thin film transistors and a method of manufacturing the semiconductor device.

2. Description of the Related Art

A display device typically includes a plurality of pixels and a driving circuit (for example, a scan driving circuit and a data driving circuit) for controlling the plurality of pixels. Each of the plurality of pixels may include a display element and a pixel driving circuit for controlling the display element. The pixel driving circuit may include a plurality of thin film transistors connected with each other.

The scan driving circuit and/or the data driving circuit may be formed through a same process as the plurality of pixels. Such driving circuits may include a plurality of thin film transistors connected with each other.

The plurality of thin film transistors of the pixel driving circuit receives bias voltages different from each other according to a driving timing, which are applied to a control electrode, an input electrode and an output electrode of each thin film transistor of the pixel driving circuit. Also, the plurality of thin film transistors of the scan driving circuit and/or the data driving circuit receives bias voltages different from each other according to a driving timing, which are applied to a control electrode, an input electrode and an output electrode of each thin film transistor of the scan driving circuit and/or the data driving circuit.

SUMMARY

The disclosure provides a semiconductor device having a high resistance to a negative bias stress and a method of manufacturing the semiconductor device.

An embodiment of the inventive concept provide a semiconductor device including a base substrate, a first thin film transistor disposed on the base substrate, a second thin film transistor disposed on the base substrate, and a plurality of insulating layers disposed on the base substrate. In such an embodiment, the first thin film transistor includes a first input electrode, a first output electrode, a first control electrode, and a first oxide semiconductor pattern, which are disposed on the base substrate. In such an embodiment, the second thin film transistor includes a second input electrode, a second output electrode, a second control electrode, and a second oxide semiconductor pattern, which are disposed on the base substrate. In such an embodiment, the first oxide semiconductor pattern includes a crystalline oxide semiconductor and the second oxide semiconductor pattern includes an oxide semiconductor having a crystal structure different from a crystal structure of the first oxide semiconductor pattern.

In an embodiment, the first control electrode may have a voltage level lower than a voltage level of the first output electrode when the first thin film transistor is turned off, and the second control electrode may have a voltage level higher than a voltage level of the second output electrode when the second thin film transistor is turned-off.

In an embodiment, the semiconductor device may further include a scan line connected to the first control electrode, a data line connected to the first input electrode and an organic light emitting diode electrically connected to the second output electrode.

In an embodiment, the semiconductor device may further include a light shielding pattern disposed between the base substrate and the first control electrode.

In an embodiment, the second oxide semiconductor pattern may include an amorphous oxide semiconductor.

In an embodiment, the first and second oxide semiconductor patterns may include an oxide of a same material.

In an embodiment, the first oxide semiconductor pattern may further include an amorphous oxide semiconductor.

In an embodiment, the plurality of insulating layers may include a first intermediate insulating layer and a second intermediate insulating layer. In such an embodiment, the first intermediate insulating layer and the second intermediate insulating layer are disposed one of between the first control electrode and the first oxide semiconductor pattern and between the second control electrode and the second oxide semiconductor pattern, and one of the first intermediate insulating layer and the second intermediate insulating layer is further disposed the other of between the first control electrode and the first oxide semiconductor pattern and between the second control electrode and the second oxide semiconductor pattern.

In an embodiment, each of the first and second intermediate insulating layers may include an inorganic layer.

In an embodiment, each of the first and second intermediate insulating layers may further include a silicon oxide layer.

In an embodiment, a thickness of the first intermediate insulating layer may be less by about 10% to about 20% than a thickness of the second intermediate insulating layer.

In an embodiment, the first oxide semiconductor pattern may be disposed between the base substrate and the first intermediate insulating layer, the second intermediate insulating layer may be disposed on the first intermediate insulating layer, and the first control electrode may be disposed on the second intermediate insulating layer.

In an embodiment, the plurality of insulating layers may further include a lower insulating layer. In such an embodiment, the lower insulating layer may be disposed between the base substrate and the second oxide semiconductor pattern, the second oxide semiconductor pattern may be disposed between the lower insulating layer and the second intermediate insulating layer, and the second control electrode may be disposed on the second intermediate insulating layer.

In an embodiment, the first control electrode may be disposed between the base substrate and the first intermediate insulating layer, and the first oxide semiconductor pattern may be disposed on the first intermediate insulating layer.

In an embodiment, the plurality of insulating layers further includes an upper insulating layer, and the upper insulating layer is disposed on the first oxide semiconductor pattern.

In an embodiment, the second control electrode may be disposed between the base substrate and the first intermediate insulating layer, the second intermediate insulating layer may be disposed on the first intermediate insulating layer, and the second oxide semiconductor pattern may be disposed on the second intermediate insulating layer.

Another embodiment of the inventive concept provide a method of manufacturing a semiconductor device, including providing a first oxide semiconductor pattern on a base substrate, where the first oxide semiconductor includes a crystalline oxide semiconductor, providing a second oxide semiconductor pattern on the base substrate, wherein the second oxide semiconductor pattern includes a oxide semiconductor having a crystal structure different from a crystal structure of the first oxide semiconductor pattern, providing a first intermediate insulating layer on the base substrate in a way such that the first intermediate insulating layer covers one of the first oxide semiconductor pattern and the second oxide semiconductor pattern and expose the other one of the first oxide semiconductor pattern and the second oxide semiconductor pattern, providing a first control electrode and a second control electrode on the base substrate in a way such that the first control electrode and the second control electrode overlap the first oxide semiconductor pattern and the second oxide semiconductor pattern, respectively, providing a first input electrode and a first output electrode on the base substrate in a way such that the first input electrode and the first output electrode are connected to the first oxide semiconductor pattern, and providing a second input electrode and a second output electrode on the base substrate in a way such that the second input electrode and the second output electrode are connected to the second oxide semiconductor pattern.

In an embodiment, the providing the first intermediate insulating layer may include providing the first intermediate insulating layer in a way such that a portion of the first intermediate insulating layer partially cover the first oxide semiconductor pattern, and the providing the second oxide semiconductor pattern may include providing the second oxide semiconductor pattern in a way such that the second oxide semiconductor pattern is disposed on another portion of the first intermediate insulating layer.

In an embodiment, the method may further include providing a second intermediate insulating layer on the portion of the first intermediate insulating layer which partially cover the first oxide semiconductor pattern and on the second oxide semiconductor pattern disposed on another portion of the first intermediate insulating layer.

In an embodiment, the method may further include providing a second intermediate insulating layer to cover the first control electrode and the second control electrode. In such an embodiment, the providing the first oxide semiconductor pattern on the base substrate may include providing the first oxide semiconductor pattern on a portion of the second intermediate insulating layer which overlaps the first control electrode, and the providing the second oxide semiconductor pattern on the base substrate may include providing the second oxide semiconductor pattern on a portion of the second intermediate insulating layer which overlaps the second control electrode.

According to embodiments, when the first thin film transistor is turned off, a negative bias voltage may be applied between the first control electrode and the first output electrode. In such embodiment, when a negative bias stress occurs in the thin film transistor, a phenomenon, in which a voltage-current characters of the first thin film transistor is shifted, may be substantially minimized.

BRIEF DESCRIPTION OF THE DRAWINGS

The above and other advantages of the disclosure will become readily apparent by reference to the following detailed description when considered in conjunction with the accompanying drawings wherein:

FIG. 9 is a cross-sectional view showing a semiconductor device according to an exemplary embodiment of the disclosure.

DETAILED DESCRIPTION

Figure 1:
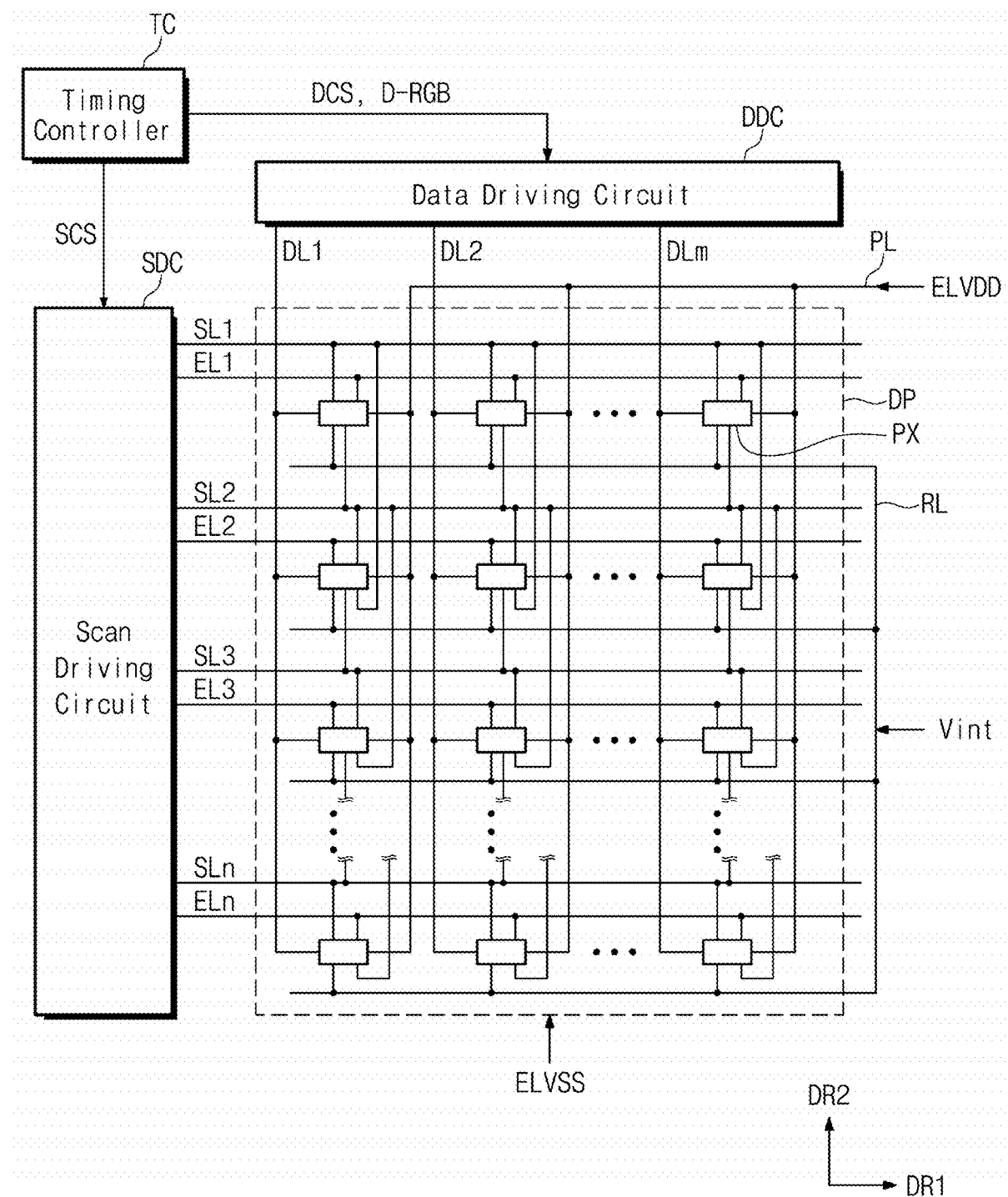
FIG. 1 is a block diagram showing a display apparatus according to an exemplary embodiment of the disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. "Or" means "and/or." As used herein, the term "and/or" includes any and all combinations of one or more of the associated listed items. It will be further understood that the terms "comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

FIG. 1 is a block diagram showing a display apparatus according to an exemplary embodiment of the disclosure. An exemplary embodiment of a display apparatus includes a timing controller TC, a scan driving circuit SDC, a data driving circuit DDC and a display panel DP. In an exemplary embodiment of the disclosure, the display panel DP may be an organic light emitting display panel. However, in such an embodiment, the type of the display panel may not be limited thereto.

In such an embodiment, the timing controller TC receives input image signals (not shown) and converts a data format of the input image signals to be suitable for the specification of the data driving circuit DDC and generate image data D-RGB. The timing controller TC may output the image data D-RGB and various control signals DCS and SCS.

In such an embodiment, the scan driving circuit SDC receives a scan control signal SCS of the various control signals DCS and SCS from the timing controller TC. The scan control signal SCS may include a vertical start signal starting an operation of the scan driving circuit SDC and a clock signal determining an output timing of the signals. The scan driving circuit SDC generates a plurality of scan signals and sequentially outputs the plurality of scan signals to a plurality of scan lines SL1 to SLn, respectively, which will be described later. In such an embodiment, the scan driving circuit SDC generates a plurality of light emitting control signals in response to the scan control signal SCS and outputs the plurality of light emitting control signals to a plurality of light emitting lines EL1 to ELn, respectively, which will be described later.

In an exemplary embodiment, as shown in FIG. 1, the plurality of scan signals and the plurality of light emitting control signals may be outputted from a same scan driving circuit SDC, but the inventive concept is not limited thereto. In an alternative exemplary embodiment of the disclosure, the display apparatus may include a plurality of scan driving circuits and each of a plurality of scan driving circuits may output one of a plurality of scan signal groups from the plurality of scan signals and output one of a plurality of light emitting control signal groups from the plurality of light emitting control signals. In an exemplary embodiment of the disclosure, a driving circuit for outputting the plurality of scan signals and a driving circuit for outputting the plurality of light emitting control signals may be provides separately.

The data driving circuit DDC receives the image data D-RGB and a data control signal DCS of the various control signals DCS and SCS from the timing controller TC. The data driving circuit DDC converts the image data D-RGB into data signals and outputs the data signals to a plurality of data lines DL1 to DLm, respectively, which will be described later. The data signals are analog voltages corresponding to gray values of the image data D-RGB.

The organic light emitting display panel DP includes the plurality of scan lines SL1 to SLn, the plurality of light emitting lines EL1 to ELn, the plurality of data lines DL1 to DLm, and a plurality of pixels PX. The plurality of scan lines SL1 to SLn extends in a first direction DR1 and is arranged in a second direction DR2 perpendicular to the first direction DR1. Each of the plurality of light emitting lines EL1 to ELn may be arranged parallel to a corresponding scan line of the plurality of scan lines SL1 to SLn. The plurality of data lines DL1 to DLm crosses the plurality of scan lines SL1 to SLn, and is insulated therefrom. Each of the plurality of pixel PX is connected to a corresponding scan line of the plurality of scan lines SL1 to SLn, a corresponding light emitting lines of the plurality of light emitting lines EL1 to ELn and a corresponding data line of the plurality of data lines DL1 to DLm.

Each of the plurality of pixels PX receives a first voltage ELVDD and a second voltage ELVSS having a lower voltage level than the first voltage ELVDD. Each of the plurality of pixel PX is connected to a power line PL to which the first voltage ELVDD is applied. The each of the plurality of pixels PX is connected to an initialize line RL which receives an initialize voltage Vint.

Each of the plurality of pixels PX may be electrically connected to three scan lines. As shown in FIG. 1, the pixels arranged in a second pixel row may be connected to a first scan line SL1 to a third scan line SL3.

Although not shown in figures, the organic light emitting display panel DP may further include a plurality of dummy scan lines. In one exemplary embodiment, for example, the organic light emitting display panel DP may further include a dummy scan line connected to pixels PX arranged in a first pixel row and a dummy scan line connected to pixels PX arranged in a last pixel row, e.g., an n-th pixel row. In an exemplary embodiment, pixels PX (hereinafter, referred to as pixels of a pixel column) which are connected to a same one of the plurality of data lines DL1 to DLm are connected with each other. Two pixels adjacent to each other among the pixels of the pixel column are electrically connected with each other.

The plurality of pixels PX may include red pixels that display a red color, green pixels that display a green color and blue pixels that display a blue color. Each of the plurality of pixels PX includes an organic light emitting diode (not shown) and a pixel driving circuit (not shown) that controls an operation of the organic light emitting diode. The organic light emitting diode of the red pixel, the organic light emitting diode of the green pixel, and the organic light emitting diode of the blue pixel may include organic light emitting layers having different materials from each other, respectively.

The pixel driving circuit may include a plurality of thin film transistor (hereinafter, referred to as the transistor) and a capacitor. At least one of the scan driving circuit SDC and the data driving circuit DDC may include a plurality of transistor that are provided or formed through a same process as the pixel driving circuit.

The plurality of scan lines SL1 to SLn, the plurality of light emitting lines EL1 to ELn, the plurality of data lines DL1 to DLm, the power line PL, the initialize line RL, the plurality of pixels PX, the scan driving circuit SDC and the data driving circuit DDC may be provided or formed on a base substrate SUB (shown in FIG. 2) through a photolithography process. A plurality of insulating layers may be provided or formed on the base substrate SUB through a deposition process and a coating process. In an exemplary embodiment, such a process may be repeatedly performed. Each of the plurality of insulating layers may be a thin film covering an entire surface of the display panel DP (e.g., an entire upper surface of the base substrate SUB that will be described referring to FIG. 2) and include at least one insulating pattern overlapping a specific element of the display panel DP. The insulating layers include an organic layer and/or an inorganic layer. In an exemplary embodiment, an encapsulation layer (not shown) for protecting the plurality of pixels PX may be disposed or formed on the base substrate SUB.

Figure 2:
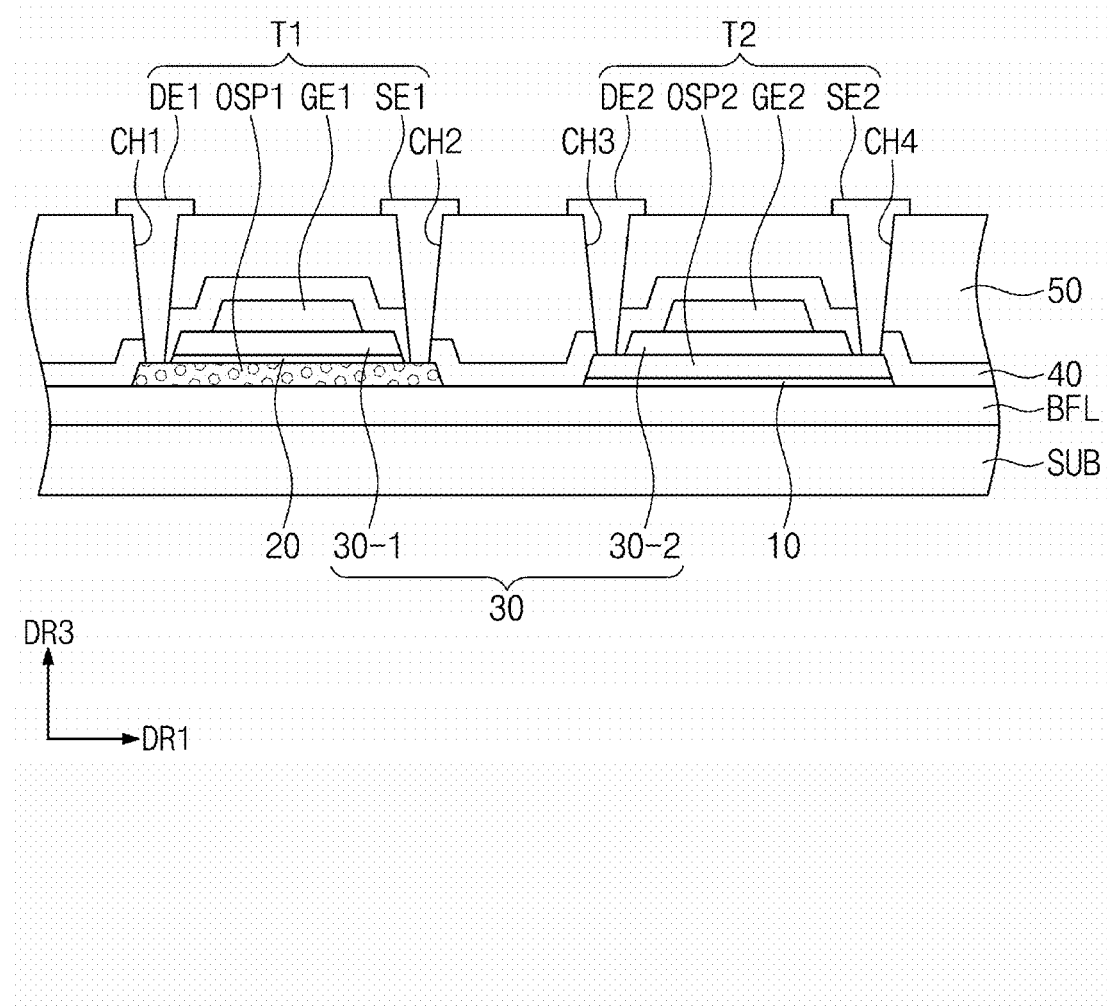
FIG. 2 is a cross-sectional view showing a semiconductor device according to an exemplary embodiment of the disclosure.
Figure 3:
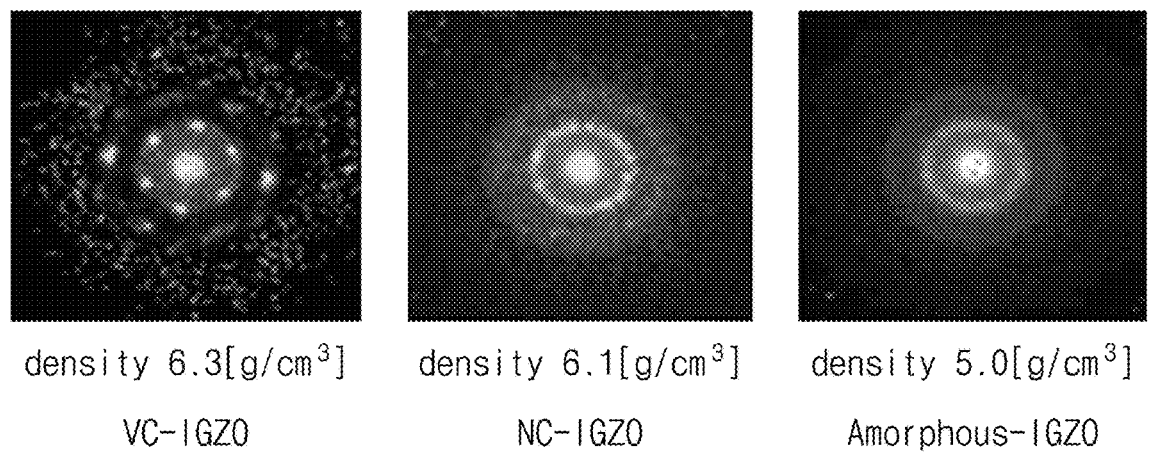
FIG. 3 is a view showing transmission electron microscopy images for crystal structures of oxide semiconductor patterns.
Figure 4:
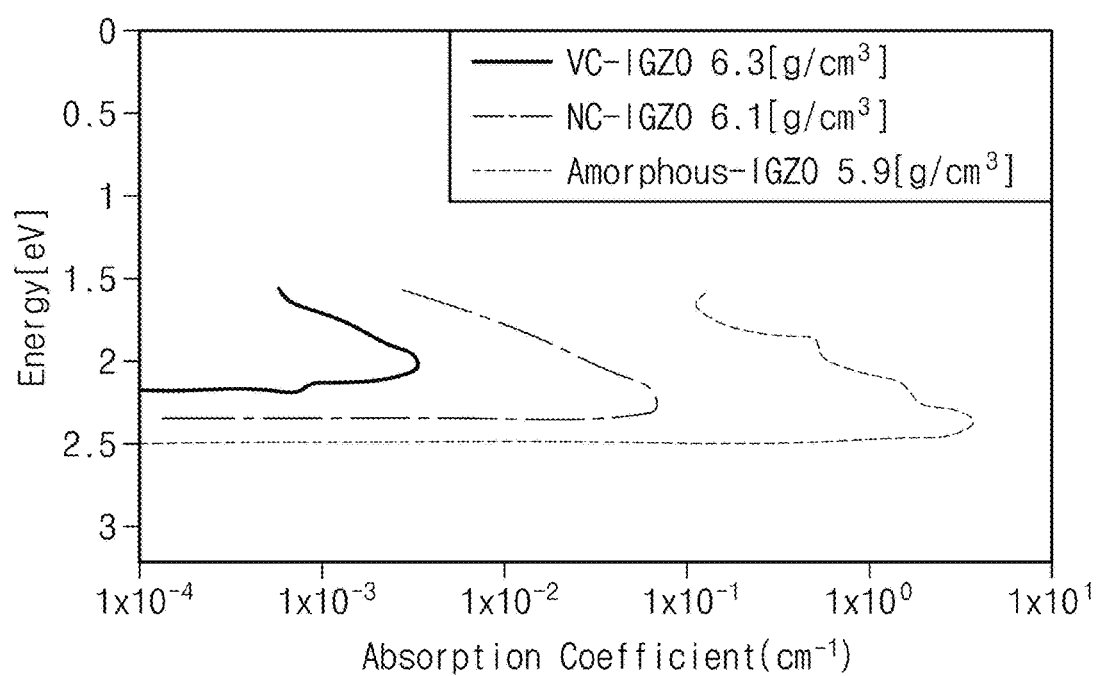
FIG. 4 is a graph showing an energy level according to an absorption coefficient of the oxide semiconductor patterns.

FIG. 2 is a cross-sectional view showing a semiconductor device according to an exemplary embodiment of the disclosure. FIG. 3 is a view showing transmission electron microscopy images for crystal structures of oxide semiconductor patterns, and FIG. 4 is a graph showing an energy level according to an absorption coefficient of the oxide semiconductor patterns.

In an exemplary embodiment, as shown in FIG. 2, the semiconductor device includes a first transistor T1 and a second transistor T2 which are disposed on the upper surface of the base substrate SUB. The upper surface of the base substrate SUB is a plane surface defined by the first direction DR1 (referring to FIG. 1) and the second direction DR2 (referring to FIG. 1). A portion of the pixel driving circuit, the scan driving circuit SDC or the data driving circuit DDC may include or be defined by the semiconductor device of FIG. 2.

The first transistor T1 includes a first input electrode DE1, a first output electrode SE1, a first control electrode GE1 and a first oxide semiconductor pattern OSP1. The second transistor T2 includes a second input electrode DE2, a second output electrode SE2, a second control electrode GE2, and a second oxide semiconductor pattern OSP2.

In an exemplary embodiment, as shown in FIG. 2, the first and second transistors T1 and T2 may be spaced apart from each other in the first direction DR1, but the inventive concept is not limited thereto. In an exemplary embodiment, the first transistor T1 and the second transistor T2 may be designed independently of each other. In an alternative exemplary embodiment, the first input electrode DE1 and the first output electrode SE1 of the first transistor T1 are spaced apart in first direction DR1, and the second input electrode DE2 and the second output electrode SE2 of the second transistor T2 are spaced apart in a different direction crossing the first direction DR1 on the upper surface of the base substrate SUB.

In an exemplary embodiment, a buffer layer BFL may be disposed on the base substrate SUB. The buffer layer BFL improves an engagement force between the base substrate SUB and conductive patterns or between the base substrate SUB and semiconductor patterns. The buffer layer BFL may further include an inorganic layer. Although not shown in figures, a barrier layer may be further disposed on the upper surface of the base substrate SUB to effectively prevent foreign substance from entering. The buffer layer BFL and the barrier layer may be selectively provided or omitted.

The base substrate SUB may include a plastic substrate, a glass substrate, or a metal substrate, for example. The plastic substrate may include at least one of an acrylic resin, a methacrylic resin, polyisoprene, a vinyl resin, an epoxy resin, urethane resin, cellulose resin, siloxane-based resin, polyimide-based resins, polyamide-based resin and perylene resin.

The first oxide semiconductor pattern OSP1 is disposed on the buffer layer BFL. In an exemplary embodiment, a first insulating layer 10 (or a lower insulating layer) is disposed on the buffer layer BFL. The first oxide semiconductor pattern OSP1 and the first insulating layer 10 are disposed directly on an upper surface of the buffer layer BFL. The first oxide semiconductor pattern OSP1 and the first insulating layer 10 are spaced apart from each other on the upper surface of the buffer layer BFL. In an alternative exemplary embodiment, the first insulating layer 10 may be omitted.

The second oxide semiconductor pattern OSP2 is disposed on the first insulating layer 10. In an exemplary embodiment, the first insulating layer 10 may be defined by an insulating pattern provided to overlap the second oxide semiconductor pattern OSP2. In such an embodiment, the second oxide semiconductor pattern OSP2 is disposed inside the first insulating layer 10 or to expose at least a portion of the first insulating layer 10, when viewed from a top plan view in the third direction DR3.

In an exemplary embodiment, a second insulating layer 20 (or a first intermediate insulating layer) and a third insulating layer 30 (or a second intermediate insulating layer) are sequentially disposed or stacked on the first oxide semiconductor pattern OSP1, and the third insulating layer 30 is further disposed on the second oxide semiconductor pattern OSP2.

The second insulating layer 20 includes an insulating pattern overlapping the first oxide semiconductor pattern OSP1. The second insulating layer 20 is disposed between the first oxide semiconductor pattern OSP1 and the third insulating layer 30.

The third insulating layer 30 includes a first insulating pattern 30-1 and a second insulating pattern 30-2, the first and second insulating patterns 30-1 and 30-2 may be disposed to overlap the first oxide semiconductor pattern OSP1 and the second semiconductor pattern OSP2, respectively. The first insulating pattern 30-1 of the third insulating layer 30 is disposed inside the insulating pattern of the second insulating layer 20 or to expose at least a portion of the insulating pattern of the second insulating layer 20, when viewed from the top plan view in the third direction DR3.

The second insulating layer 20 exposes two areas of the first oxide semiconductor pattern OSP1. A plane shape of the exposed two areas is not particularly limited. In a cross-section view, the second oxide semiconductor pattern OSP2 include a first area overlapping the third insulating layer 30, a second area and a third area between which the first area is disposed.

The second insulating pattern 30-2 exposes two areas of the second oxide semiconductor pattern OSP2. A plane shape of the exposed two areas is not particularly limited. In a cross-section view, the second oxide semiconductor pattern OSP2 includes a first area, a second area and a third area. The first area is overlapping the second insulating pattern 30-2 and disposed between the second area and the third area.

The first control electrode GE1 is disposed on the first insulating pattern 30-1, and the second control electrode GE2 is disposed on the second insulating pattern 30-2. A fourth insulating layer 40 (i.e., an upper insulating layer) is disposed on the buffer layer BFL. The fourth insulating layer 30 may at least partially cover elements disposed between the first control electrode GE1 and the buffer layer BFL and elements disposed between the second control electrode GE2 and the buffer layer BFL.

In an exemplary embodiment, A fifth insulating layer 50 is disposed on the fourth insulating layer 40. The fifth insulating layer 50 may provide a flat upper surface. The fifth insulating layer 50 may include an organic material and/or inorganic material. In an alternative exemplary embodiment of the disclosure, the fifth insulating layer 50 may be omitted.

A first contact hole CH1 and a second contact hole CH2 are defined or formed through the insulating layers to expose the second and third areas of the first oxide semiconductor OSP1, respectively. A third contact hole CH3 and a fourth contact hole CH4 are defined or formed through the insulating layers to expose the second and third areas of the second oxide semiconductor OSP2, respectively. In one exemplary embodiment, for example, the first to fourth contact holes CH1 to CH4 are defined or formed through the fourth and fifth insulating layers 40 and 50.

In an exemplary embodiments of the disclosure, the second insulating layer 20 and/or the third insulating layer 30 may completely cover the first oxide semiconductor pattern OSP1 and the second oxide semiconductor pattern OSP2. In such an embodiment, each of the first to fourth contact holes CH1 to CH4 may be defined or formed through the second insulating layer 20 and/or the third insulating layer 30.

The first input electrode DE1 and the first output electrode SE1 are disposed on the fifth insulating layer 50. The first input electrode DE1 and the first output electrode SE1 are contacted with or connected to the second and third areas of the first oxide semiconductor patterns OSP1 via the first and second contact holes CH1 and CH2, respectively. The second input electrode DE2 and the second output electrode SE2 are disposed on the fifth insulating layer 50. The second input electrode DE2 and the second output electrode SE2 are contacted with or connected to the second and third areas of the second oxide semiconductor patterns OSP2 via the third and fourth contact holes CH3 and CH4, respectively.

The first to fourth insulating layers 10 to 40 may include inorganic materials. The inorganic materials may include at least one of aluminum oxide, titanium oxide, silicon oxide, silicon oxynitride, zirconium oxide, and hafnium oxide.

The first and second insulating layers 10 and 20 may be disposed on different layers from each other or be simultaneously provided or formed through a same process. In an exemplary embodiment, where the first and second insulating layers 10 and 20 are simultaneously provided or formed through a same process, the first insulating layer 10 and the second insulating layer 20 may include a same material and have a same thickness.

The third insulating layer 30 may include a same material as the second insulating layer 20. The third insulating layer 30 may have a greater thickness than the second insulating layer 20. A thickness of the second insulating layer 20 may be less by about 10% to about 20% than a thickness of the third insulating layer 30. In one exemplary embodiment, for example, the thickness of the third insulating layer 30 may be in a range of about 1000 angstrom (Å) to about 2000 Å, and the thickness of the second insulating layer 20 may be in a range of about 100 Å to about 400 Å.

In an exemplary embodiment where the second insulating layer 20 is disposed only on the first transistor T1 has relatively a thin thickness, a current gain of the first transistor T1 may be increased. A capacitance reduction rate per unit area of the first control electrode GE1 of the transistor T1 may be minimized compare to the second transistor T2.

The first insulating layer 10, the second insulating layer 20 and the third insulating layer 30 may include a same material as each other. The first insulating layer 10, the second insulating layer 20 and the third insulating layer 30 may include an inorganic layer. The inorganic layer may have a low hydrogen concentration. The hydrogen concentration of the inorganic layer may be less than 1021 per square centimeter (/cm$^2$). The first to third insulating layers 10 to 30 are in contact with the first and second oxide semiconductor patterns OSP1 and OSP2, to prevent the first and second oxide semiconductor patterns OSP1 and OSP2 from being reduced by the hydrogen of high concentration and to have conductivity during a process for forming inorganic layer. A silicon oxide layer having a relatively low hydrogen concentration may be applied to the first to third insulating layers 10 to 30.

The first and second oxide semiconductor patterns OSP1 and OSP2 may include an indium tin oxide ("ITO"), an indium-gallium-zinc oxide ("IGZO"), a zinc oxide (ZnO) or an indium-zinc oxide ("IZO"), for example. The first and second oxide semiconductor patterns OSP1 and OSP2 may include an oxide of a same material. The first oxide semiconductor pattern OSP1 may include a crystalline oxide semiconductor. The crystalline oxide semiconductor may be crystalized in a vertical direction. In FIG. 2, the vertical direction represents a third direction DR3 and is defined as a normal direction vertical to the upper surface of the base substrate SUB. A vertical crystalline oxide semiconductor may be defined as an oxide semiconductor having a growth axis parallel to a normal direction of the semiconductor pattern (e.g., a channel area). In addition, the vertical crystalline oxide semiconductor may be defined as a c-axis aligned crystal oxide semiconductor. The first oxide semiconductor pattern OSP1 may be partially crystalized. Therefore, the first oxide semiconductor pattern OSP1 may further include an amorphous oxide semiconductor.

The second oxide semiconductor pattern OSP2 includes an oxide semiconductor having a different crystal structure from the crystal structure of the first oxide semiconductor pattern OSP1. The second oxide semiconductor pattern OSP2 may include an amorphous oxide semiconductor. In an exemplary embodiment, the second oxide semiconductor pattern OSP2 may include a crystalline oxide semiconductor. However, a density (or a grain size) of the crystalline oxide semiconductor in the second oxide semiconductor pattern OSP2 may be smaller than the density (or a grain size) of the crystalline oxide semiconductor in the first oxide semiconductor pattern OSP1. Herein, the vertical crystalline oxide semiconductor may have crystallinity between an amorphous semiconductor and a single crystal semiconductor.

In an alternative exemplary embodiment, the second oxide semiconductor pattern OSP2 may include a crystalline oxide semiconductor, and the first oxide semiconductor pattern OSP1 may include an oxide semiconductor having a different crystal structure from that the crystal structure of the second oxide semiconductor pattern OSP2.

FIG. 3 is a view showing transmission electron microscopy images for a vertical crystal indium-gallium-zinc oxide ("YC-IGZO"), a nano crystal indium-gallium-zinc oxide ("NC-IGZO"), and an amorphous indium-gallium-zinc oxide ("Amorphous-IGZO"). The density of the oxide semiconductor may increase depending on the size of the crystal increases.

According to FIG. 4, the energy level corresponding to the absorption coefficient is reduced as the size of the crystal is increased. The energy levels corresponding to the absorption coefficient are calculated from the graphs of FIG. 4 are shown in Table 1 below.

TABLE 1

| Absorption Coefficients at Sub-gap states (cm$^{-1}$) | |
| --- | --- |
| VC-IGZO | $5.8 \times 10^{-4}$ |
| NC-IGZO | $1.6 \times 10^{-2}$ |
| Amorphous-IGZO | $5.3 \times 10^{0}$ |

Referring to FIG. 2 to FIG. 4, as described above, the first transistor T1 has a smaller absorption coefficient than the second transistor T2 in the Sub-gap states.

The transistor T1 has a reduced oxygen deficient compare to the second transistor T2 such that the voltage-current characteristics of the first thin transistor T1 may not be shifted or shifted a little bit toward the negative side even when the negative bias stress is applied to the first transistor T1. Because of the deep-level traps of the first transistor T1 is reduced by the crystallization of the first oxide semiconductor pattern OSP1, variation amount ΔVth of the threshold voltage by the above negative bias temperature illumination stress ("NBTIS") is reduced. Accordingly, it may be minimized that the threshold voltage of the first transistor T1 is shifted toward the negative side.

Although not shown in figures, in an exemplary embodiment, the stack structures of the first and second thin film transistors T1 and T2 may be variously modified. In such an embodiment, the first oxide semiconductor pattern OSP1 includes a crystalline oxide semiconductor, e.g., vertical crystalline oxide semiconductor, and the second oxide semiconductor pattern OSP2 includes an oxide semiconductor having a different crystal structure from the first oxide semiconductor pattern OSP1, e.g., an amorphous oxide semiconductor.

In one alternative exemplary embodiment, for example, one of the second insulating layer 20 and the first insulating pattern 30-1 may be disposed between the first oxide semiconductor pattern OSP1 and the first control electrode GE1, and the other of the second insulating layer 20 and the first insulating pattern 30-1 may be disposed between the first oxide semiconductor pattern OSP1 and the buffer layer BFL. The position of the first insulating layer 10 may be changed between the second oxide semiconductor pattern OSP2 and the second control electrode GE2.

FIGS. 5A to 5I are cross-sectional views showing a method of manufacturing the semiconductor device according to an exemplary embodiment of the disclosure.

Figure 5A:
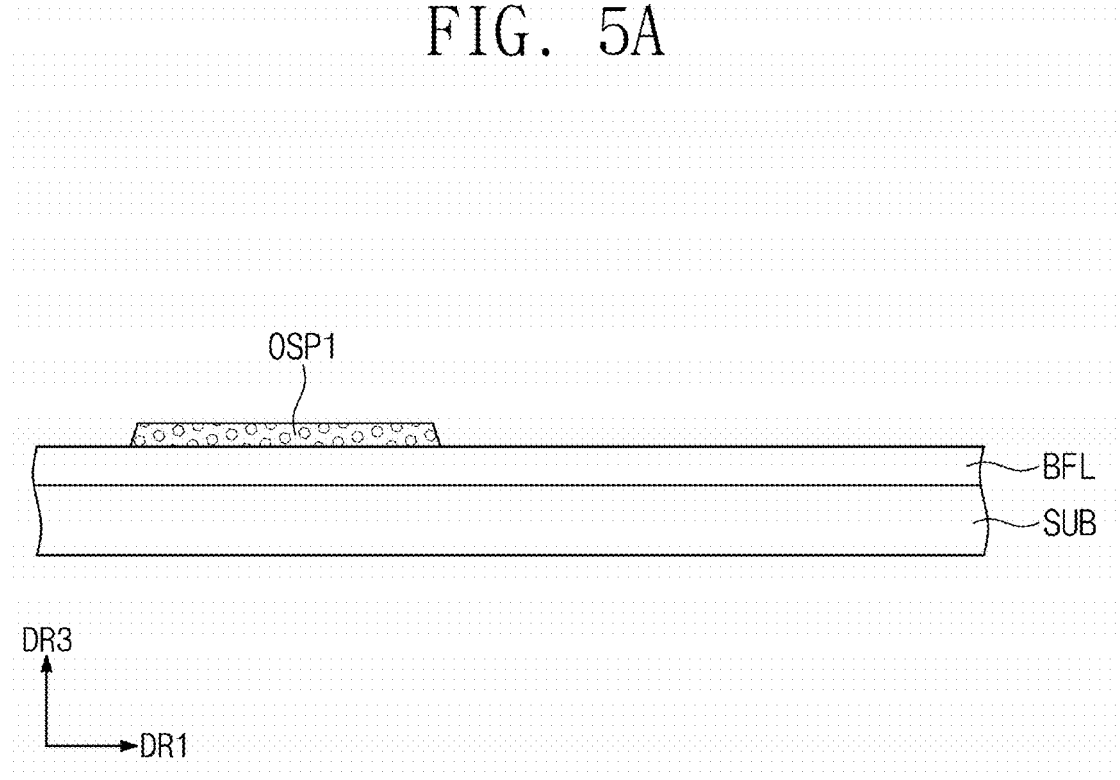
FIGS. 5A to 5i are cross-sectional views showing a method of manufacturing the semiconductor device according to an exemplary embodiment of the disclosure.

In an exemplary embodiment, as shown in FIG. 5A, the buffer layer BFL is provided or formed on the upper surface of the base substrate SUB. An inorganic material may be deposited, coated or printed to form the buffer layer BFL. The first oxide semiconductor pattern OSP1 is provided or formed on a partial region of the buffer layer BFL. After forming an oxide semiconductor layer on the entire upper surface of the buffer layer BFL, the oxide semiconductor layer may be patterned through a photo lithography process.

In such an embodiment, a process condition for forming the oxide semiconductor may be controlled to adjust the crystal characters of the oxide semiconductor. In such an embodiment, the oxide semiconductor layer may be provided or formed through a sputtering process, and a temperature, a power, process pressure or oxygen partial pressure, for example, of the sputtering process may be adjusted. In one exemplary embodiment, for example, when the oxygen partial pressure and the power are increased, the crystalline oxide semiconductor layer may be formed.

Figure 5B:
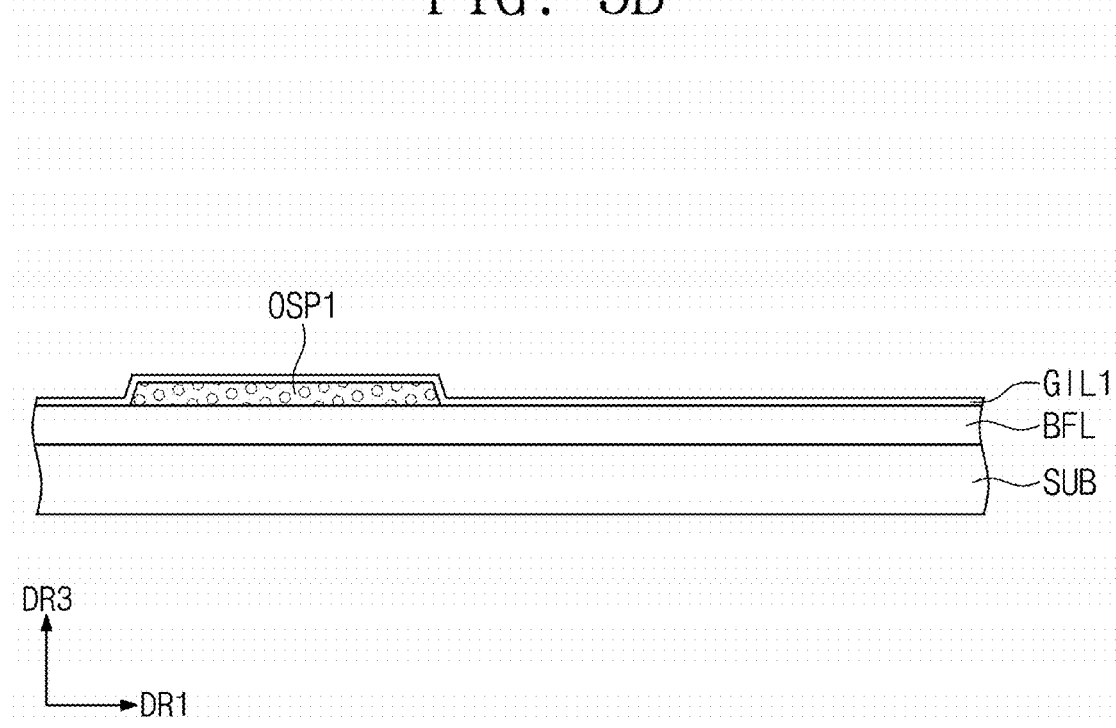

In an exemplary embodiment, as shown in FIG. 5B, the first gate insulating layer GIL1 is provided or formed on the buffer layer BFL and the first oxide semiconductor pattern OSP1 thereon. An inorganic material or an organic material may be deposited, coated or printed to form the first gate insulating layer GIL1.

Figure 5C:
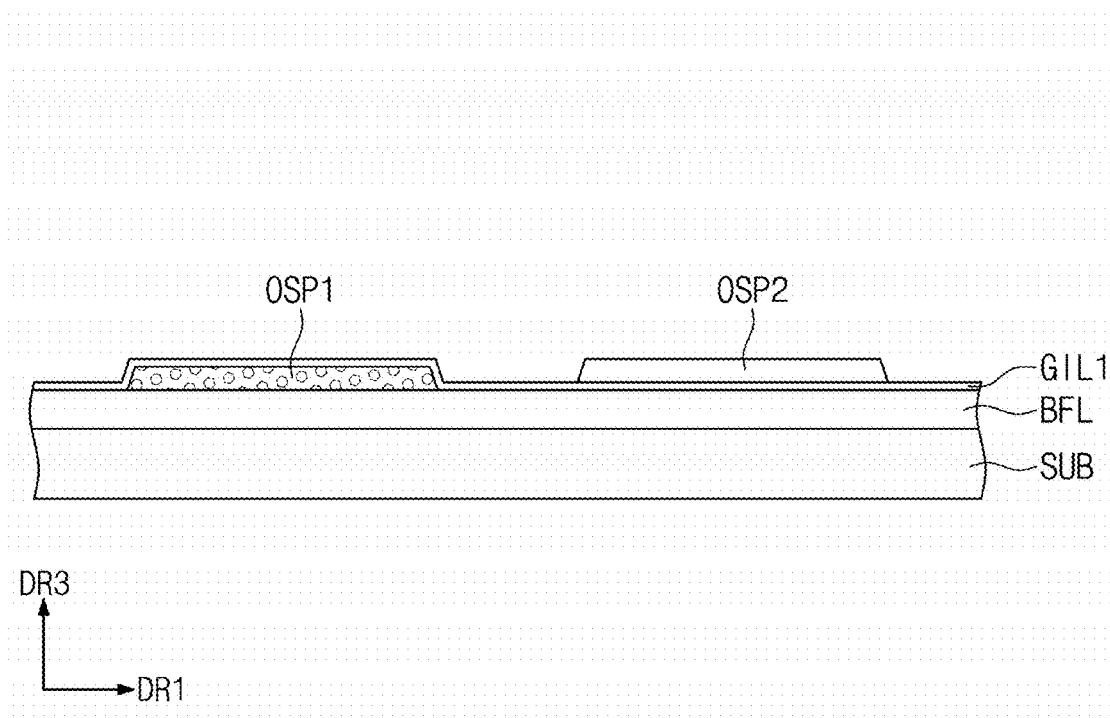

In an exemplary embodiment, as shown in FIG. 5C, the second oxide semiconductor pattern OSP2 is provided or formed on the first gate insulating layer GIL1. After forming an oxide semiconductor layer on the entire upper surface of the first gate insulating layer GILL the oxide semiconductor layer may be patterned through a photo lithography process to form the second oxide semiconductor pattern OSP2.

Figure 5D:
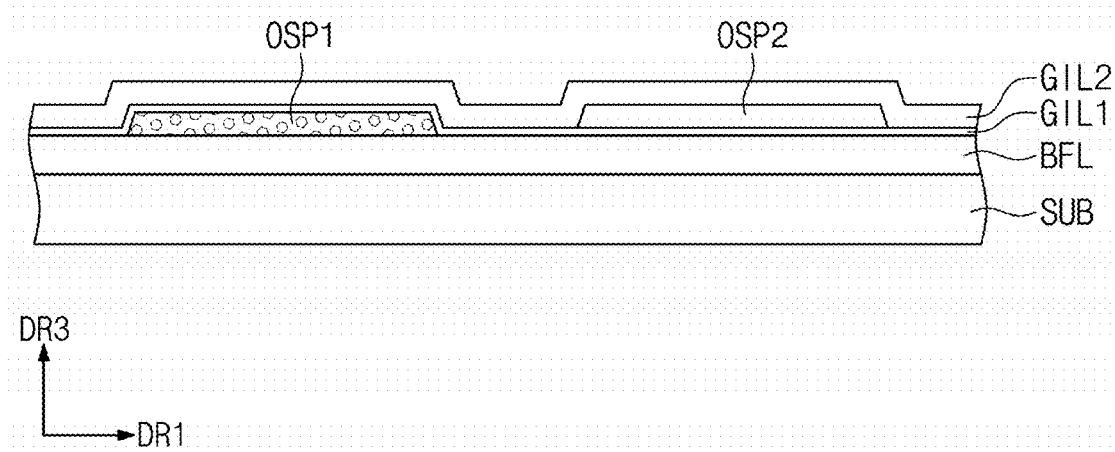

In an exemplary embodiment, as shown in FIG. 5D, the second gate insulating layer GIL2 is provided or formed on the first gate insulating layer GIL1 to cover and the first oxide semiconductor pattern OSP1 and the second oxide semiconductor pattern OSP2. The second gate insulating layer GIL2 may be provided or formed on the entire upper surface of the first gate insulating layer GIL1. An inorganic material or an organic material may be deposited, coated or printed to form the second gate insulating layer GIL2.

Figure 5E:
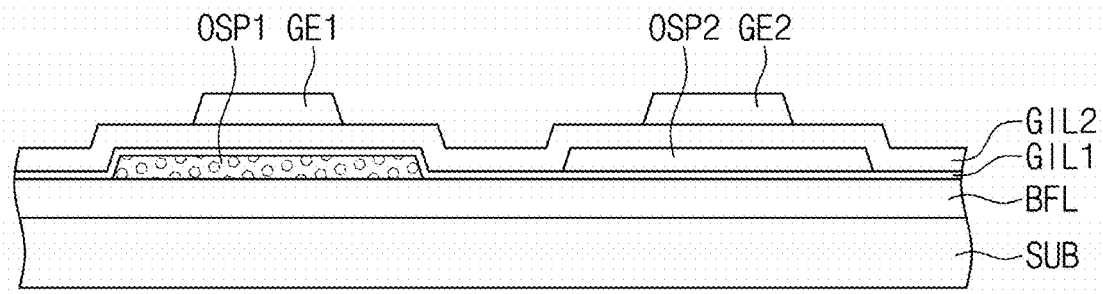

In an exemplary embodiment, as shown in FIG. 5E, the first and second control electrodes GE1 and GE2 are provided or formed on the second gate insulating layer GIL2. After forming a conductive layer on the second gate insulating layer GIL2, the conductive layer is patterned with conductive patterns in a way such that the conductive patterns overlap the first and second oxide semiconductor patterns OSP1 and OSP2, respectively. The conductive layer may be provided or formed through a deposit process.

Figure 5F:
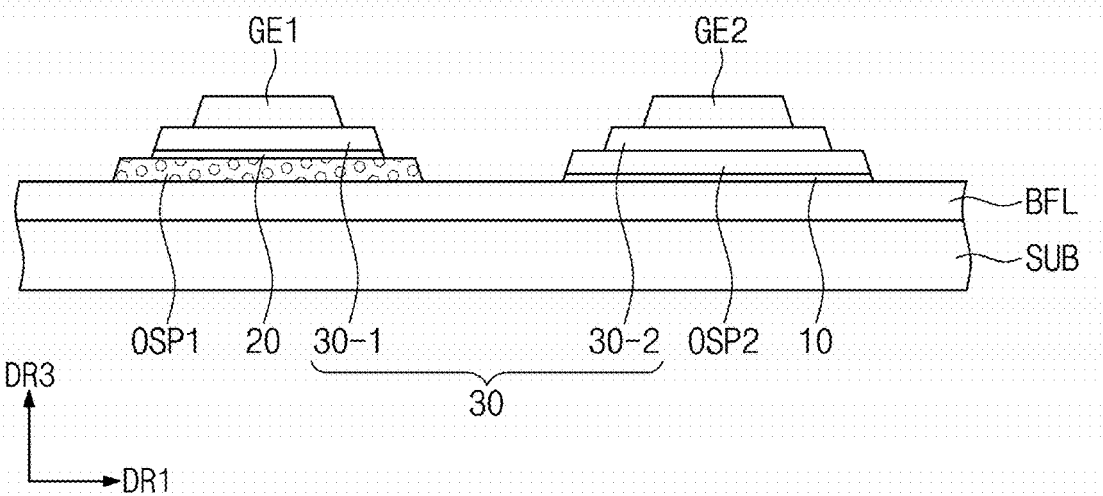

In an exemplary embodiment, as shown in FIG. 5F, the first and second gate insulating layers GIL1 and GIL2 are patterned. In such an embodiment, the first and second gate insulating layers GIL1 and GIL2 are patterned using an etchant in a way such that the second and third areas defined in both end portions of the first oxide semiconductor pattern OSP1 are exposed. The second gate insulating layer GIL2 is patterned using a same etchant a way such that the second and third areas defined in both end portions of the second oxide semiconductor pattern OSP2 are exposed. The first gate insulating layer GIL1 is etched beside a region overlapping an insulating pattern of the second insulating layer 20 (referring to FIG. 2) on the first oxide semiconductor pattern OSP1 and a region overlapping the second oxide semiconductor pattern OSP2. In such an embodiment, the first insulating layer 10 and the second insulating layer 20 shown in FIG. 2 are formed from the first gate insulating layer GIL1. In such an embodiment, the first and second insulating patterns 30-1 and 30-2 of the third insulating layer 30 are formed from the second gate insulating layer GIL2.

Figure 5G:
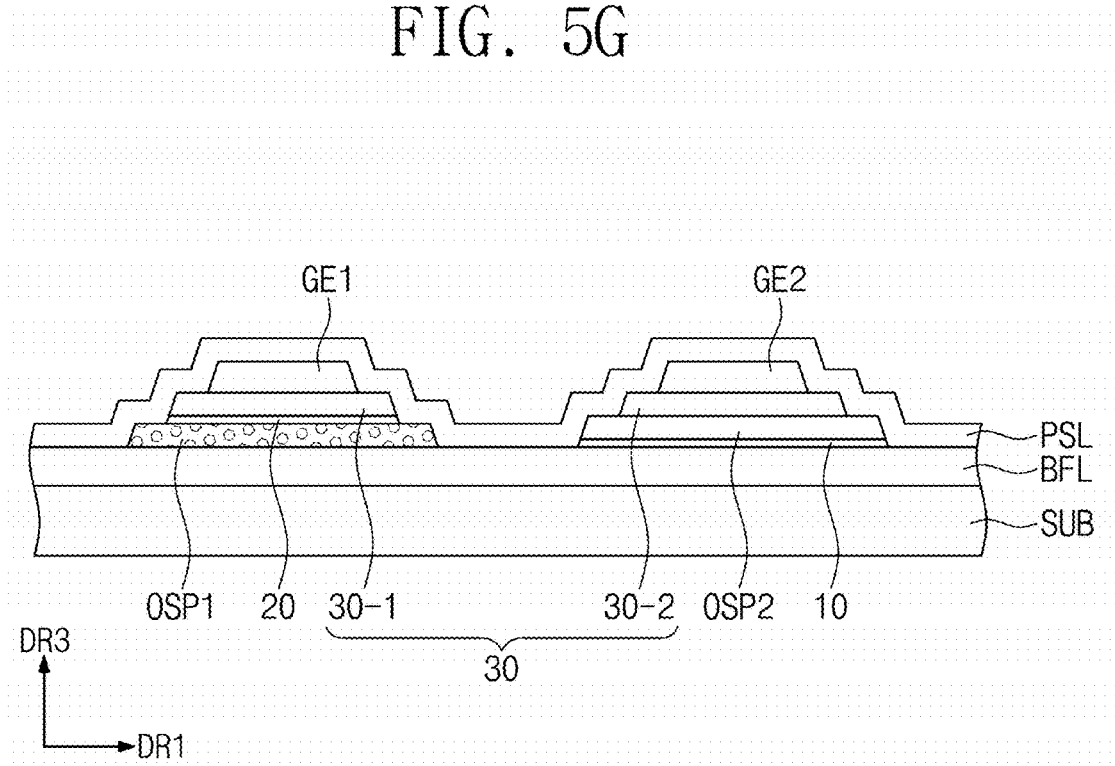

In an exemplary embodiment, as shown in FIG. 5G, a passivation layer PSL is provided or formed on the buffer flayer BFL. The passivation layer PSL may be provided or formed on the entire upper surface of the buffer layer BFL to cover layers provided on the supper surface of the buffer layer BFL. An inorganic material or an organic material may be deposited, coated or printed to form the passivation layer PSL. The passivation layer PSL corresponds to the fourth insulating layer 40 of FIG. 2.

Figure 5H:
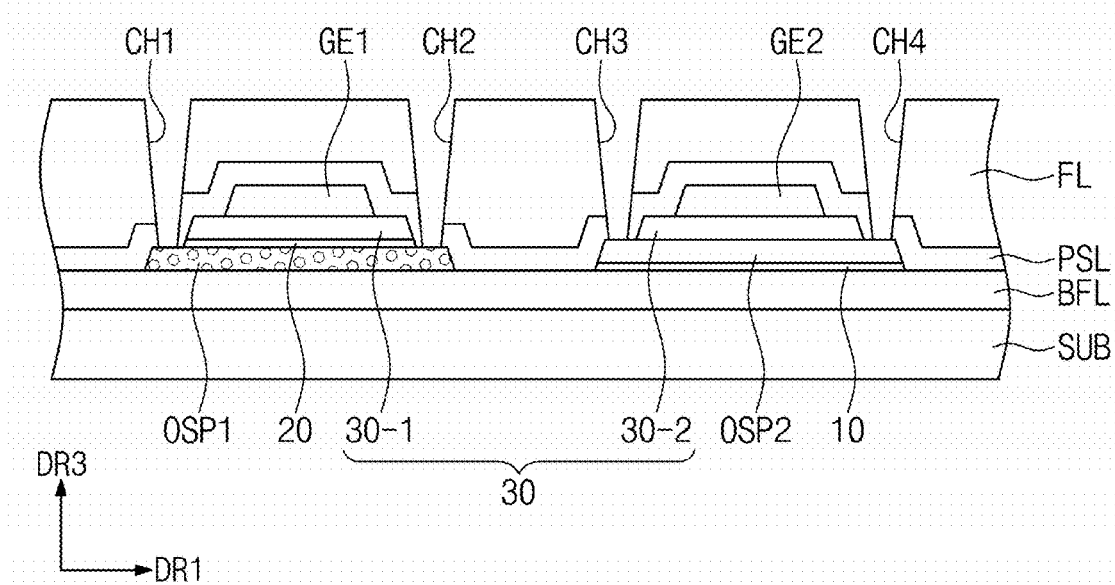

In an exemplary embodiment, as shown in FIG. 5H, a planarization layer FL is provided or formed on the passivation layer PSL, and first to fourth contact holes CH1 to CH4 are formed through the planarization layer FL. The planarization layer FL corresponds to the fifth insulating layer 50 of FIG. 2. An inorganic material or an organic material may be deposited, coated or printed to form the planarization layer FL. The first to fourth contact holes CH1 to CH4 are formed through a photo lithography process. Each of the first to fourth contact holes CH1 to CH4 penetrates the planarization layer FL and the passivation layer PSL.

Figure 5I:
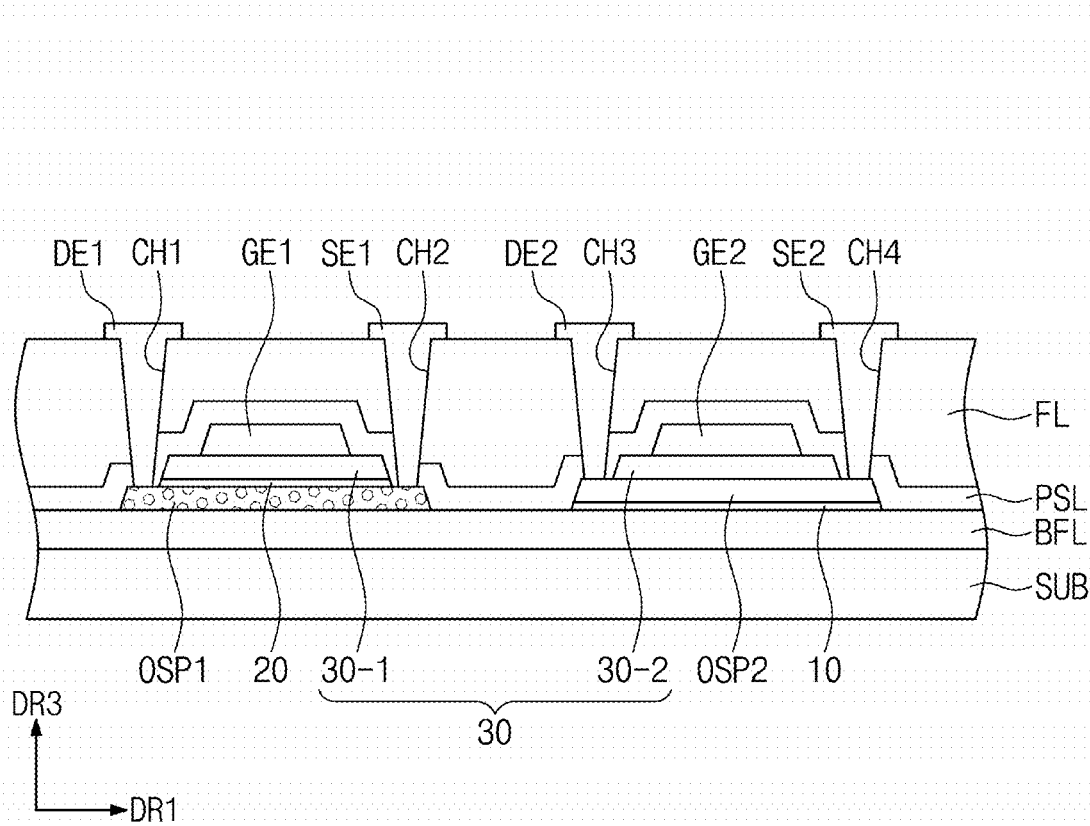

In an exemplary embodiment, as shown in FIG. 5I, the first input electrode DE1, the first output electrode SE1, the second input electrode DE2 and the second output electrode SE2 are provided or formed on the planarization layer FL. After forming a conductive layer on the planarization layer FL through the deposit, coating or printing process, the conductive layer is patterned through the photo lithography process to form the first output electrode SE1, the second input electrode DE2 and the second output electrode SE2.

The first input electrode DE1 and the first output electrode SE1 are provided to extend in the first and second contact holes CH1 and CH2 to contact the second and third areas of the first oxide semiconductor pattern OSP1 via the first and second contact holes CH1 and CH2, respectively. The second input electrode DE2 and the second output electrode SE2 are provided to extend in the third and fourth contact holes CH3 and CH4 to contact the second and third areas of the second oxide semiconductor pattern OSP2 via the third and fourth contact holes CH3 and CH4. An organic emitting diode may be further provided or formed on the planarization layer FL to form the display panel from the semiconductor device shown in FIG. 5I.

Figure 6:
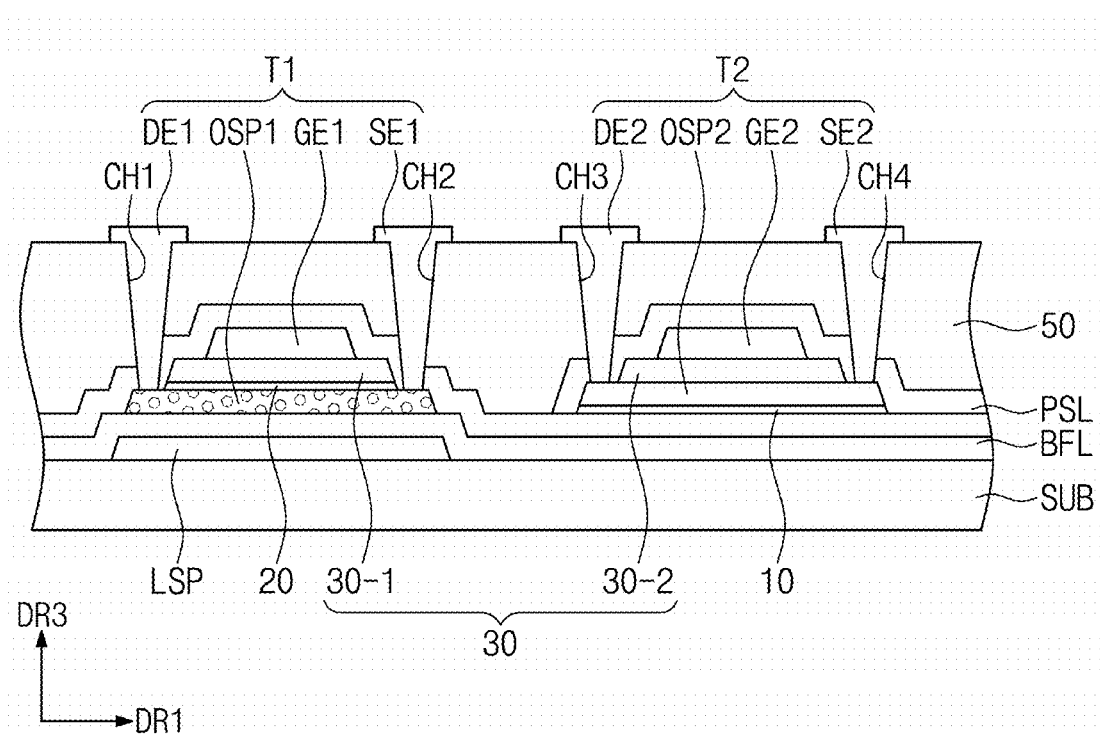
FIG. 6 is a cross-sectional view showing a semiconductor device according to an exemplary embodiment of the disclosure.

FIG. 6 is a cross-sectional view showing a semiconductor device according to an exemplary embodiment of the disclosure.

In an exemplary embodiment, as shown in FIG. 6, the semiconductor device further includes a light shielding pattern LSP disposed between the base substrate SUB and the first control electrode GE1. The light shielding pattern LSP may effectively prevent an external light from being applied to the first oxide semiconductor pattern OSP1. Here, the external light includes light inputted from an exterior of the display device or light generated from the organic emitting diode of the display device. The light shielding pattern LSP includes a material that blocks the light, and the material of the light shielding pattern LSP is not particularly limited. The light shielding pattern LSP may include a colored organic material including a dye and a pigment, an inorganic material or a metal having a specific color.

In such an embodiment, before providing the buffer layer BFL described above referring to FIG. 5A, a preliminary light shielding layer may be provided on the base substrate SUB, and then the preliminary light shielding layer may be patterned to form the light shielding layer LSP. In an alternative exemplary embodiment, the light shielding layer may be printed on a specific area of the base substrate SUB to form the light shielding pattern LSP. The light shielding pattern LSP has a larger size than the first oxide semiconductor pattern OSP1 so that the first oxide semiconductor pattern OSP1 is disposed inside the light shielding pattern LSP when viewed from the top plan view. The light shielding pattern LSP may effectively prevent the threshold voltage of the first transistor T1 from shifting toward the negative side by light emitted to the first transistor T1. When the light is applied to the first oxide semiconductor pattern OSP1, NBTIS phenomenon is accelerated. In such an embodiment, the light shielding pattern LSP may effectively block the light being supplied to the first oxide semiconductor pattern OSP1. The light shielding pattern LSP which is disposed under the transistor having a top gate structure blocks the external light approaching from an exterior of the base substrate SUB. In an exemplary embodiment of the disclosure, the organic light emitting display panel may be implemented with a transparent panel, and the external light may be a natural light.

The semiconductor device according to an exemplary embodiment of the disclosure may further include a light shielding pattern to effectively prevent the external light from being applied to the second oxide semiconductor pattern OSP2.

Figure 7A:
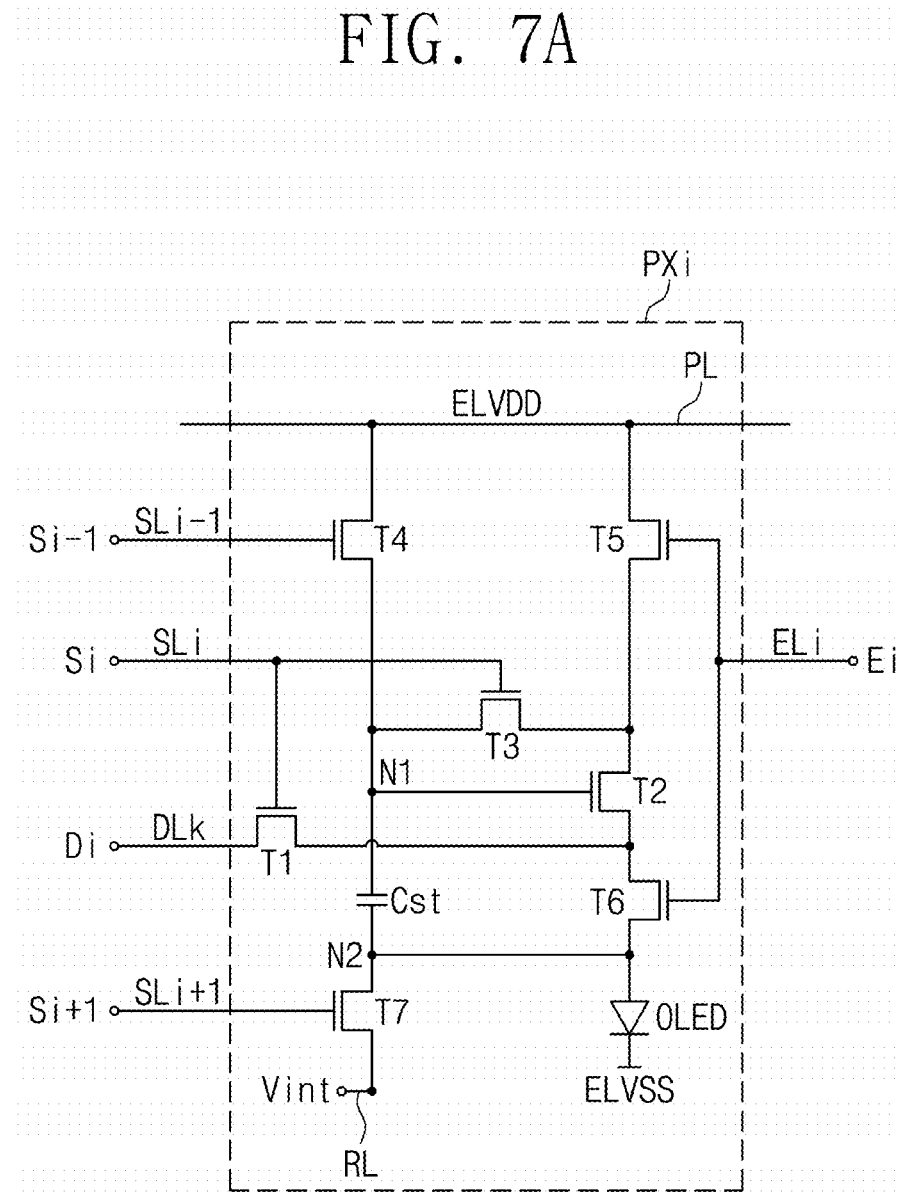
FIG. 7A is an equivalent circuit diagram of a pixel according to an exemplary embodiment of the disclosure.
Figure 7B:
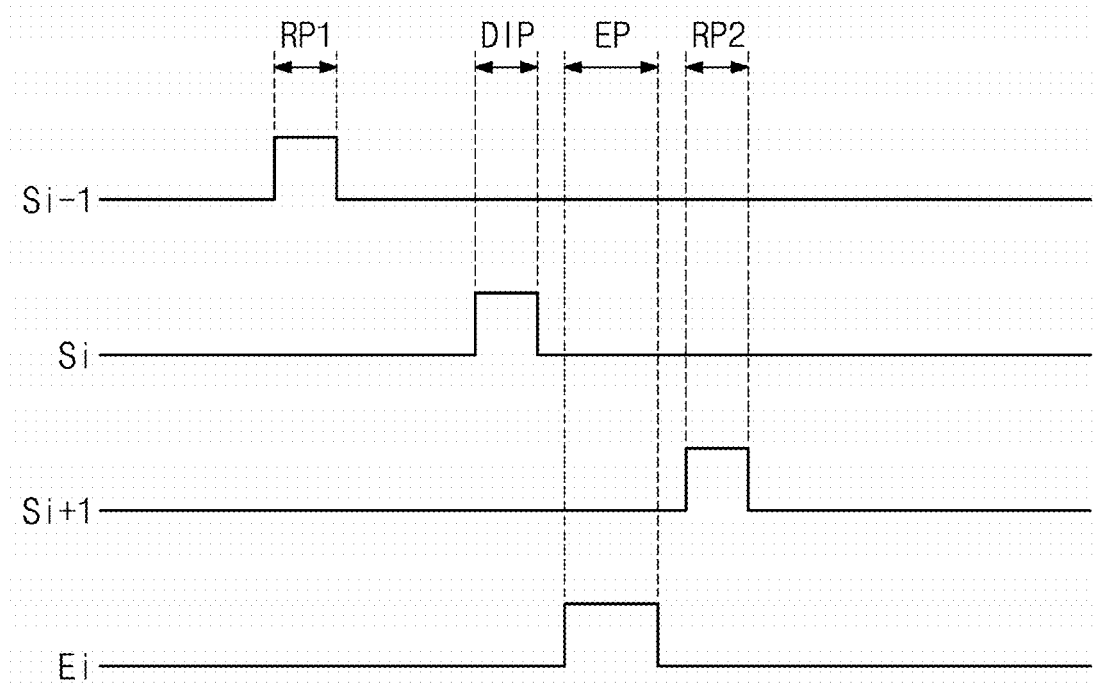
FIG. 7B is a waveform diagram showing driving signals for driving the pixel shown in FIG. 7A.

FIG. 7A is an equivalent circuit diagram of a pixel according to an exemplary embodiment of the disclosure, and FIG. 7B is a waveform diagram showing driving signals for driving the pixel shown in FIG. 7A. In FIG. 7A, only an i-th pixel PXi connected to a k-th data line DLk among the plurality of data lines DL1 to DLm is shown for convenience of illustration.

The i-th pixel PXi includes an organic light emitting diode OLED and a pixel driving circuit that controls the organic light emitting diode OLED. The pixel driving circuit may include seven transistors T1 to T7, and a single capacitor Cst. In FIG. 7, one exemplary embodiment, where each of the seven transistors T1 to T7 is a n-type thin film transistor, is illustrated. Herein, the transistor may refer to the thin film transistor.

A driving transistor controls a driving current supplied to the organic light emitting diode OLED. In an exemplary embodiment of the disclosure, the driving transistor may be the second transistor T2. The output electrode of the second transistor T2 is connected to the organic light emitting diode OLED. The output electrode of the second transistor T2 may be directly contacted with or connected to an anode of the organic light emitting diode OLED or may be connected to the organic light emitting diode OLED through another transistor.

A control electrode of a control transistor may receive a control signal. The control signal applied to the i-th pixel PXi includes an (i−1)-th scan signal Si−1, an i-th scan signal Si, an (i+1)th scan signal Si+1, a data signal Di and an i-th light emitting control signal Ei. In an exemplary embodiment of the invention, the control transistor may include a first transistor T1, a third transistor T3, a fourth transistor T4, a fifth transistor T5, a sixth transistor T6 and a seventh transistor T7.

A node between an output electrode of the fourth transistor T4 and a control electrode of the second transistor T2 is defined as a first node N1, and a node between the seventh transistor T7 and the storage capacitor Cst is defined as a second node N2.

The second transistor T2 includes an input electrode that receives a first voltage ELVDD via the firth transistor T5, a control electrode coupled to the first node N1, and an output electrode. The output electrode of the second transistor T2 provides the first voltage ELVDD to the organic light emitting diode OLED through the sixth transistor T6. The input electrode of the second transistor T2 is coupled to the first node N1 passing through the third transistor T3. The second transistor T2 controls the driving current supplied to the organic light emitting diode OLED in response to the voltage level of the first node N1.

The first transistor T1 includes an input electrode connected to the k-th data line DLk, a control electrode connected to an i-th scan line SLi, and an output electrode connected to the output electrode of the second transistor T2. The first transistor T1 is turned on by a scan signal Si (hereinafter, referred to as the i-th scan signal) applied to the i-th scan line SLi and supplies the dada signal Di applied to the k-th data line DLk to the storage capacitor Cst. The first transistor T1 may be referred to as a switching transistor.

The third transistor T3 includes an input electrode connected to the input electrode of the second transistor T2, a control electrode connected to the i-th scan line SLi, and an output electrode coupled to the first node N1. The third transistor T3 is turned on in response to the i-th scan signal Si.

When the first and third transistors T1 and T3 are turned on, the second transistor T2 is connected between the first and third transistors T1 and T3 in a diode form. Accordingly, the first transistor T1 is electrically connected to the first node N1 through the turned-on second and third transistors T2 and T3.

The storage capacitor Cst is coupled between the first node N1 and the organic light emitting diode OLED. The storage capacitor Cst charges a voltage corresponding to a voltage applied to the first node N1.

The fourth transistor T4 includes an input electrode connected to the power line PL, a control electrode that receives the (i−1)-th scan signal Si−1, and an output electrode coupled to the first node N1. The fourth transistor T4 is switched in response to the (i−1)-th scan signal Si−1. The control electrode of the fourth transistor T4 may be connected to the (i−1)-th scan signal SLi−1. A signal line, to which the (i−1)-th scan signal Si−1 is applied, may be changed to a dummy signal line.

The fifth transistor T5 includes an input electrode connected to the power line PL, a control electrode connected to the i-th light emitting line ELi, and an output electrode coupled to the input electrode of the second transistor T2. The fifth transistor T5 is turned on or off in response to the i-th light emitting control signal Ei.

The sixth transistor T6 includes an input electrode coupled to the output electrode of the second transistor T2, a control electrode connected to the i-th light emitting line Ei, and an output electrode coupled to the anode of the organic light emitting diode OLED. The sixth transistor T6 is turned on or off in response to the i-th light emitting control signal Ei supplied from the i-th light emitting line ELi.

A current path is formed or not formed between the power line PL and the organic light emitting diode OLED according to an operation of the fifth and sixth transistors T5 and T6. In an alternative exemplary embodiment of the disclosure, any one of the fifth and sixth transistors T5 and T6 may be omitted.

The seventh transistor T7 includes an input electrode connected to the initialize line RL, a control electrode that receives the (i+1)-th scan signal Si+1, and an output electrode coupled to the anode of the organic light emitting diode OLED. A signal line to which the (i+1)-th scan signal Si+1 is applied may be changed to a dummy signal line.

When the fourth transistor T4 is turned-on, the first node N1 is reset by the first voltage ELVDD. When the seventh transistor T7 is turned-on, the second node N2 is initialized by the initialize voltage Vint. The anode of the organic light emitting diode OLED is initialized by the initialize voltage Vint when the seventh transistor T7 is turned-on. A potential difference between the initialize voltage Vint and the second voltage ELVSS applied to the cathode of the organic light emitting diode OLED may be smaller than the threshold voltage of the organic light emitting diode OLED.

Referring to FIG. 7A and FIG. 7B, the operation of the i-th pixel PXi will be described in detail. The organic light emitting display panel DP (referring to FIG. 1) may display an image every one frame period. The plurality of scan lines SL1 to SLn are sequentially scanned by the plurality of scan signals during each of the frame periods. FIG. 7B shows a part of any one frame period.

The (i−1)-th scan signal Si−1 is activated during a first initialize period RP1. In an exemplary embodiment of the disclosure, the signals shown in FIG. 7B are activated when the signals have a high level. The high level of each signal among the signals shown in FIG. 7B may correspond to turn-on voltage of the transistor to which a corresponding signal of the signals is applied.

When the fourth transistor T4 is turned on by the (i−1)-th scan signal Si−1, the first voltage ELVDD is applied to the first node N1. The i-th scan signal Si is activated during a data input period DIP defined after the first initialize period PR1. The first and third transistors T1 and T3 are turned on by the i-th scan signal Si activated during the data input period DIP, the second transistor T2 is connected between the first transistor T1 and the third transistor T3 in a diode form.

The data signal Di is applied to the k-th data line DLk during the data input period DIP. The data signal Di is supplied to the first node N1 through the first transistor T1, the second transistor T2 and the third transistor T3, which are turned on. Here, since the second transistor T2 is connected between the first transistor T1 and the third transistor T3 in a diode form, the difference voltage between the data signal Di and the threshold voltage of the first transistor T1 is applied to the first node N1. The difference voltage between the first node N1 and the second node N2 is stored in the storage capacitor Cst during the data input period DIP. The second node N2 is already initialized by the initialize voltage during a previous frame.

The i-th light emitting control signal Ei is not activated during the first initialization period PR1 and the data input period DIP and is activated during a light emitting period EP defined after the data input period DIP. The fifth transistor T5 and the sixth transistor T6 are turned on by the i-th light emitting control signal Ei, and the voltage charged in the storage capacitor Cst is applied to the control electrode of the second transistor T2.

The current path is formed between the power line PL and the organic light emitting diode OLED by the i-th light emitting control signal Ei. Accordingly, the organic light emitting diode OLED emits the light during the light emitting period EP. The organic light emitting diode OLED emits the light with a brightness corresponding to the voltage charged in the storage capacitor Cst.

The (i+1)-th scan signal Si+1 is activated during a second initialize period RP2 defined after the light emitting period EP. When the seventh transistor T7 is turned on by the (i+1)-th scan signal Si+1, the initialize voltage Vint is applied to the second node N2, and the anode of the organic light emitting diode OLED is initialized by the initialize voltage Vint. Therefore, the organic light emitting diode OLED stops emitting light during the second initialize period RP2.

In one exemplary embodiment, as shown in FIG. 7B, predetermined delay periods are provided between the first initialize period RP1, the data input period DIP, the light emitting period EP, and the second initialize period RP2, but not being limited thereto. In an alternative exemplary embodiment of the disclosure, the first initialize period RP1, the data input period DIP, the light emitting period EP, and the second initialize period RP2 may be continuously arranged without a delay period therebetween.

The first transistor T1 corresponds to the first thin film transistor T1 described above referring to FIG. 2 to FIG. 5I. The voltage level of the control electrode of the first transistor T1 is lowered after the data input period DIP, and the voltage level of the output electrode of the first transistor T1 is raised. Therefore, the negative bias voltage is applied between the control and output electrodes of the first transistor T1. When the first transistor T1 is turned off, the voltage of the control electrode of the first transistor T1 has a lower voltage level than the voltage of the output electrode of the first transistor T1. The negative bias voltage puts the negative bias stresses on the first transistor T1. In addition, when the light generated from the organic light emitting diode OLED and the nature light from the exterior are applied to the first transistor T1, the NBTIS is accelerated.

Because of the first transistor T1 includes the crystalline oxide semiconductor, although the NBTIS is applied to the thin film transistor, a phenomenon in which a voltage-current characters of the first transistor T1 is shifted may be effectively prevented or substantially minimized.

The second transistor T2 corresponds to the second transistor T2 described above referring to FIG. 2 to FIG. 5I. The data signal is applied to the storage capacitor Cst during the data input period DIP. During the light emitting period EP, the positive bias voltage is applied between the control electrode and the output electrode of the second transistor T2. That is, the voltage applied to the control electrode of the second transistor T2 has a higher level than the voltage applied to the output electrode of the second transistor T2.

The second transistor T2 which includes the amorphous oxide semiconductor is configured to have a strong resistance to the positive voltage stress. In an exemplary embodiment, the amorphous oxide semiconductor of the second transistor T2 may have a low electron traps to minimize the phenomenon in which voltage-current characters of the second transistor T2 is shifted. When the amorphous oxide semiconductor is formed in the low oxygen partial pressure state, the electron traps of the amorphous oxide semiconductor may be reduced. The inorganic layer (for example, a silicon nitride may be used instead of a silicon oxide) having a relatively high hydrogen content may be used as the fourth insulating layer 40 (referring to FIG. 2). The hydrogen of the fourth insulating layer 40 performs a role of the passivation layer for the channel of the amorphous oxide semiconductor.

Referring to FIG. 7A and FIG. 7B, the i-th pixel PXi is described as an exemplary embodiment of a pixel, but is not limited thereto. The pixel PXi include the organic light emitting diode OLED and the pixel driving circuit that drives the organic light emitting diode OLED, and the pixel driving circuit may include only the switching transistor, the driving transistor, and the capacitor. Structure and configuration of the pixel driving circuit are not particularly limited. In FIG. 7A, one exemplary embodiment where the control transistor includes six transistors is illustrated, but is not limited thereto, the control transistor may consist of transistors of less than six or more than six.

Figure 8A:
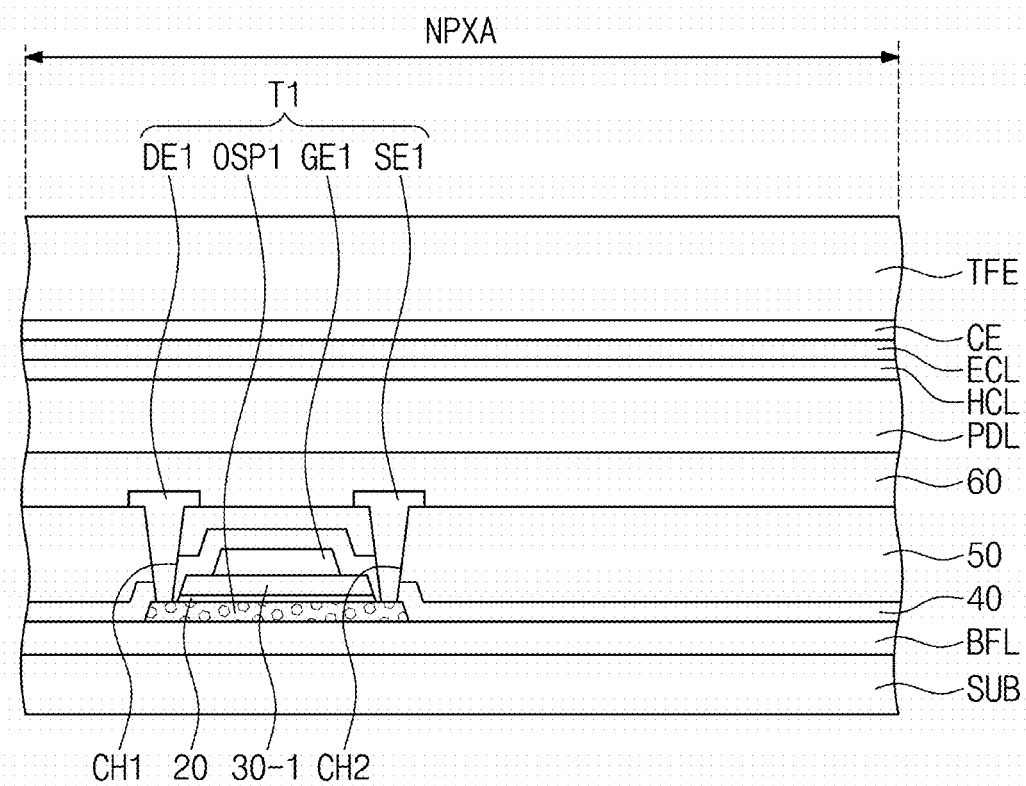
FIGS. 8A and 8B are cross-sectional views showing a pixel according to an exemplary embodiment of the disclosure.
Figure 8B:
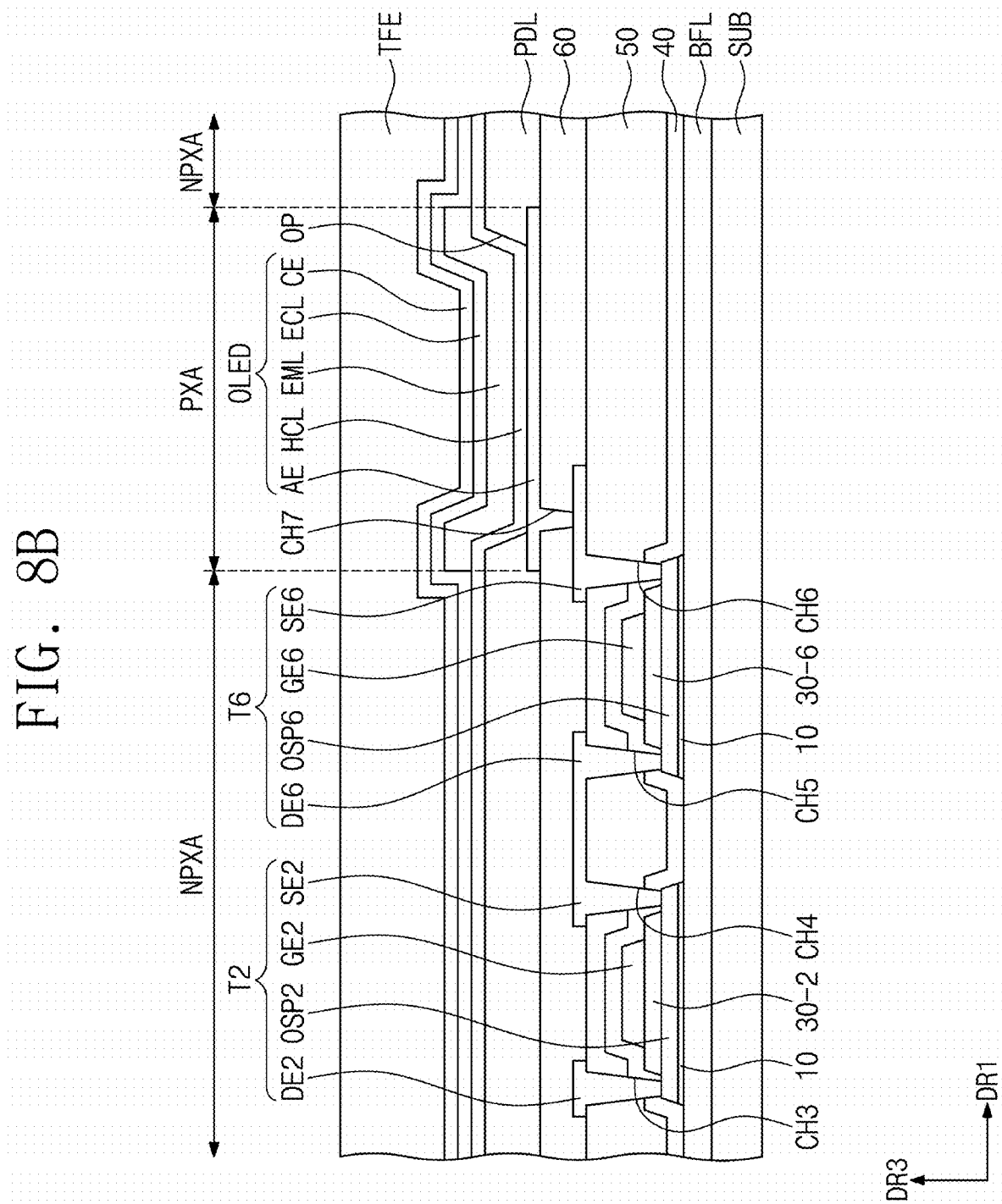

FIG. 8A and FIG. 8B are cross-sectional views showing the pixel PX (referring to FIG. 1) according to an exemplary embodiment of the disclosure. FIG. 8A shows the cross section of the first transistor T1 shown in FIG. 7A. FIG. 8B shows the cross section of the second transistor T2, the sixth transistor T6, and the organic light emitting diode OLED shown in FIG. 7A.

The first transistor T1 of FIG. 8A corresponds to the first transistor T1 shown in FIG. 2, the second transistor T2 of FIG. 8B corresponds to the second transistor T2 shown in FIG. 2. Referring to the cross sections of the FIG. 8A and FIG. 8B, the cross section structure of from the base substrate SUB to the fifth insulating layer 50 is substantially the same as the cross section structure shown in FIG. 2, and any repetitive detailed description of the cross section structure under the fifth insulating layer 50 will be omitted.

In an exemplary embodiment, as shown in FIG. 8B, the sixth transistor T6 may have substantially a same structure as the second transistor T2, but not being limited thereto. Alternatively, the structure of the sixth transistor T6 may be variously modified. The input electrode DE6 of the sixth transistor T6 is connected to the output electrode SE2 of the second transistor T2 on the fifth insulating layer 50.

A sixth insulating layer 60 may be disposed on the fifth insulating layer 50. The sixth insulating layer 60 may include an organic layer or/and an inorganic layer. A pixel define layer PDL and the organic light emitting diode OLED are disposed on the sixth insulating layer 60. The anode of the organic light emitting diode OLED is disposed on the sixth insulating layer 60. The anode AE is contacted with or connected to the output electrode SE6 of the sixth transistor T6 via a seventh contact hole CH7 defined through the sixth insulating layer 60. An opening OP is defined in the pixel define layer PDL. The opening OP of the pixel define layer PDL exposes at least a portion of the anode AE.

The pixel PX may be disposed in a pixel area on the plane of the display panel DP (referring to FIG. 1). The pixel area includes a light emitting area PXA and a non-light emitting area NPXA adjacent to the light emitting area PXA. The non-light emitting area NPXA may surround the light emitting area PXA. In an exemplary embodiment of the disclosure, the light emitting area PXA is defined as an area corresponding to the anode AE, e.g., an area overlapping the anode AE when viewed from the top plan view. However, the light emitting area PXA is not limited thereto, and alternatively, the light emitting area PXA may be defined as area in which the light is emitted in the pixel area. In such an embodiment, the light emitting area PXA may be defined as an area in which a portion of the anode AE is exposed by the opening OP.

A hole control layer HCL is disposed in both of the light emitting area PXA and the non-light emitting area NPXA. Although not shown in figures, a common layer such as the hole control layer HCL may be commonly provided or formed over the plurality of pixels.

A hole control layer HCL is disposed on an light emitting layer EML. The organic light emitting layer EML may be disposed only in an area corresponding to the opening OP. In such an embodiment, the organic light emitting layer EML may be formed corresponding to a corresponding pixel among the plurality of pixels PX.

An electron control layer ECL is disposed on the organic light emitting layer EML. A cathode CE is disposed on the electron control layer ECL. The cathode CE is commonly disposed over the plurality of pixels PX. The cathode CE may be integrally formed as a single unitary and indivisible unit and disposed to cover the plurality of pixels PX.

A thin encapsulation layer TFE is disposed on the cathode CE. The thin encapsulation layer TFE is commonly provided or formed over the plurality of pixels PX. In an exemplary embodiment, the thin encapsulation layer TFE includes at least one inorganic layer and at least one organic layer. In an exemplary embodiment, the thin encapsulation layer TFE may include a plurality of inorganic layers and a plurality of organic layers which are alternately stacked with each other.

In an exemplary embodiment of the disclosure, the organic light emitting layer EML, which is patterned so that one organic light emitting layer EML is disposed for each pixel, is illustrated in FIG. 8B. However, in an alternative exemplary embodiment of the disclosure, the organic light emitting layer EML may be commonly disposed over the plurality of pixels. In such an embodiment, the organic light emitting layer EML may generate a white light. In an exemplary embodiment, the organic light emitting layer EML may have a multiple layer structure.

In an exemplary embodiment of the disclosure, the thin encapsulation layer TFE directly covers the cathode CE. In an alternative exemplary embodiment of the disclosure, a capping layer may be further disposed to cover the cathode CE. In such an embodiment, the thin encapsulation layer TFE may directly cover the capping layer.

FIG. 9 is a cross-sectional view showing a semiconductor device according to an exemplary embodiment of the disclosure. FIGS. 10A to 10G are cross-sectional views showing a method of manufacturing the semiconductor device according to an exemplary embodiment of the disclosure.

In an exemplary embodiment, as shown in FIG. 9, the semiconductor device may include transistors T1 and T2 having a bottom-gate structure. In FIG. 9, an exemplary embodiment, where the transistors T1 and T2 have an inverted staggered structure is illustrated, but not being limited thereto. Alternatively, the transistors T1 and T2 may have an inverted co-planer structure.

The first control electrode GE1 and the second control electrode GE2 are disposed on the buffer layer BFL. The first and second control electrodes GE1 and GE2 are directly disposed on the upper surface of the buffer layer BFL. The first insulating layer 100 (i.e., the first intermediate insulating layer) is disposed on the buffer layer BFL. The first insulating layer 100 covers the first control electrode GE1 and the second control electrode GE2. The first insulating layer 100 may cover the entire upper surface of the buffer layer BFL.

The first oxide semiconductor pattern OSP1 is disposed on the first insulating layer 100 to overlap the first control electrode GE1. The second insulating layer 200 (i.e., the second intermediate insulating layer) is disposed on the first insulating layer 100 to overlap the second control electrode GE2. The second insulating layer 200 exposes the first oxide semiconductor pattern OSP1 overlapping the first control electrode GE1. In one exemplary embodiment, for example, an opening is defined through the second insulating layer 200 to expose the first oxide semiconductor pattern OSP1 overlapping the first control electrode GE1.

The second oxide semiconductor pattern OSP2 is disposed on the second insulating layer 200 to overlap the second control electrode GE2. The second oxide semiconductor pattern OSP2 is disposed inside the second control electrode GE2 on the plane.

The third insulating layer 300 (i.e., an upper insulating layer) is disposed on the first oxide semiconductor pattern OSP1. The third insulating layer 300 is substantially an insulating pattern overlapping a central area of the first oxide semiconductor pattern OSP1. Both end portions of the first oxide semiconductor pattern OSP1 may be exposed by the insulating pattern of the third insulating layer 300. The both end portions of the first oxide semiconductor pattern OSP1 may be defined as two end portions opposite to each other in the first direction DR1. In an alternative exemplary embodiment of the disclosure, the third insulating layer 300 may be omitted.

The first input electrode DE1 and the first output electrode SE1 are disposed on the first oxide semiconductor pattern OSP1. The first input electrode DE1 is contacted with or connected to the end portion of the first oxide semiconductor pattern OSP1 and the end portion of the insulating pattern of the third insulating layer 300, and the first output electrode SE1 is contacted with or connected to the opposite end portion of the first oxide semiconductor pattern OSP1 and the opposite end portion of the insulating pattern of the third insulating layer 300.

The second input electrode DE2 and the second output electrode SE2 are disposed on the second oxide semiconductor pattern OSP2. The second input electrode DE2 is contacted with or connected to the end portion of the second oxide semiconductor pattern OSP2, and the second output electrode SE2 is contacted with or connected to the opposite end portion of the second oxide semiconductor pattern OSP2. The second input electrode DE2 and the second output electrode SE2 is spaced apart from each other in the first direction DR1.

Although not shown in the figures, at least one insulating layer may be further disposed on the base substrate SUB to cover the first input electrode DE1, the first output electrode SE1, the second input electrode DE2 and the second output electrode SE2. In one exemplary embodiment, as shown in FIG. 9, the fourth insulating layer 400 having a planarization upper surface is disposed on the base substrate SUB to cover the first input electrode DE1, the first output electrode SE1, the second input electrode DE2 and the second output electrode SE2. The at least one insulating layer may have contact holes which expose the first input electrode DE1, the first output electrode SE1, the second input electrode DE2, and the output electrode SE2.

The first insulating layer 100 to the third insulating layer 300 may include an inorganic material. The inorganic material may include at least one of an aluminum oxide, a titanium oxide, a silicon oxide, a silicon oxynitride, a zirconium oxide, and a hafnium oxide. The first insulating layer 100 to the third insulating layer 300 may include a same material as each other.

In an exemplary embodiment, the second insulating layer 200 and the third insulating layer 300 are disposed on different layers from each other, but may be provided or formed through a same process. In such an embodiment, the second insulating layer 200 and the third insulating layer 300 may include a same material and have a same thickness.

In an exemplary embodiment, the second insulating layer 200 may include a same material as the first insulating layer 100. The second insulating layer 200 may have a smaller thickness than the first insulating layer 100. The thickness of the second insulating layer 200 is less by about 10% to about 20% than a thickness of the first insulating layer 100.

The fourth insulating layer 400 may include an organic material and/or an inorganic material. In an exemplary embodiment, the fourth insulating layer 400 may include the organic material to provide the planarization upper surface.

The first and second oxide semiconductor patterns OSP1 and OSP2 have different crystal structures from each other, but may include an oxide of a same material. In an exemplary embodiment, the first oxide semiconductor pattern OSP1 includes a crystalline oxide semiconductor. The crystalline oxide semiconductor may be crystalized in the vertical direction or the third direction DR3. The first oxide semiconductor OSP1 may further include an amorphous oxide semiconductor.

The second oxide semiconductor pattern OSP2 has a crystal structure different from a crystal structure of the first oxide semiconductor pattern OSP1. The second oxide semiconductor OSP2 may include an amorphous oxide semiconductor. In such an embodiment, the second oxide semiconductor pattern OSP2 may include a crystalline oxide semiconductor. But, a density (or a grain size) of the crystalline oxide semiconductor in the second oxide semiconductor pattern OSP2 may be smaller than the density (or a grain size) of the crystalline oxide semiconductor in the first oxide semiconductor pattern OSP1.

In an alternative exemplary embodiment, although not shown in the figures, a stack structure of the first and second thin film transistors T1 and T2 may be variously modified. In such an embodiment, the first oxide semiconductor pattern OSP1 includes the crystalline oxide semiconductor, e.g., includes the vertical crystalline oxide semiconductor, and the second oxide semiconductor pattern OSP2 includes a different crystal structure from the first oxide semiconductor pattern OSP1, e.g., includes the amorphous oxide semiconductor.

In one alternative exemplary embodiment, for example, the second insulating layer 200 between the second oxide semiconductor pattern OSP2 and the second control electrode GE2 may be omitted, and the second insulating layer 200 may be disposed between the first insulating layer 100 and the first oxide semiconductor pattern OSP1. In an exemplary embodiment, the third insulating layer 300 on the first oxide semiconductor pattern OSP1 may be omitted, and the third insulating layer 300 may be disposed on the second oxide semiconductor pattern OSP2.

Figure 10A:
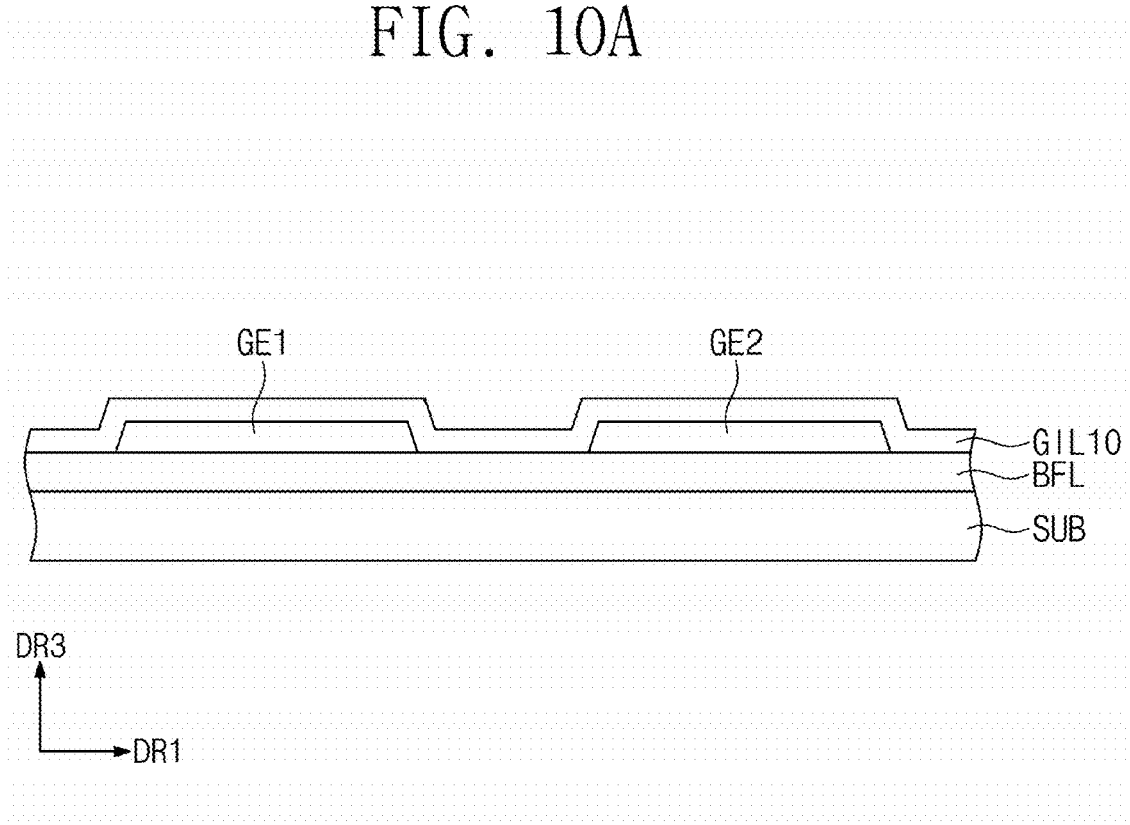
FIGS. 10A to 10G are cross-sectional views showing a method of manufacturing the semiconductor device according to an exemplary embodiment of the disclosure.

Hereinafter, an exemplary embodiment of the method of manufacturing the semiconductor device of FIG. 9 will be described referring to FIG. 10A to FIG. 10G. In an exemplary embodiment, as shown in FIG. 10A, the buffer layer BFL is provided or formed on the upper surface of the base substrate SUB. The first control electrode GE1 and the second control electrode GE2 are provided or formed on the buffer layer BFL. After providing a conductive layer on the upper surface of the buffer layer BFL, the conductive layer may be patterned through a photolithography process to form the first and second control electrodes GE1 and GE2.

Figure 10B:
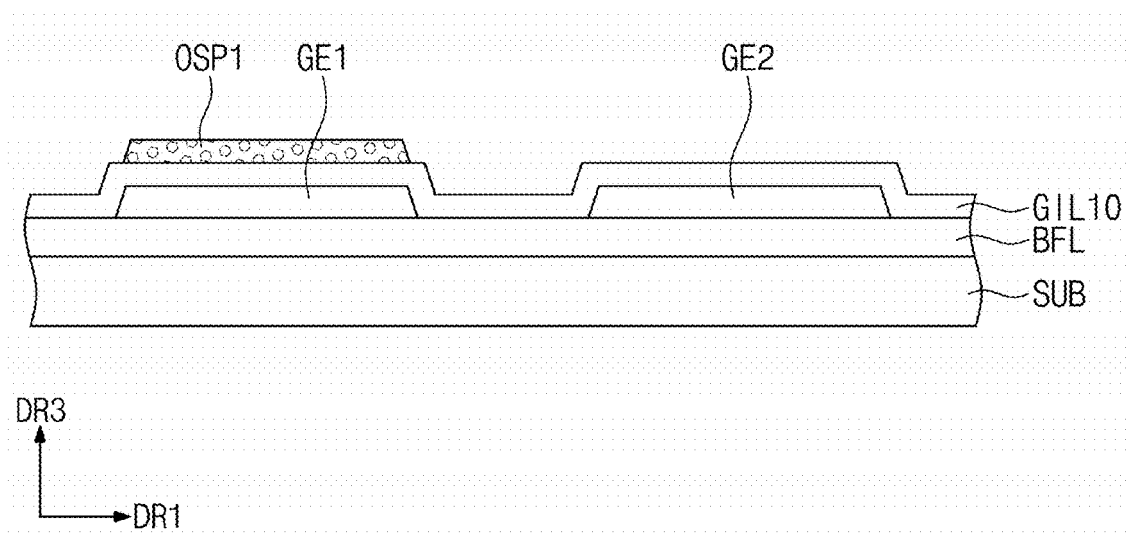

In an exemplary embodiment, as shown in FIG. 10B, a first gate insulating layer GIL10 is provided or formed on the buffer layer BFL. An inorganic material or an organic material may be deposited, coated or printed to form the first gate insulating layer GIL10. The first gate insulating layer GIL10 corresponds to the first insulating layer 100 of FIG. 9.

The first oxide semiconductor pattern OSP1 is provided or formed on the first gate insulating layer GIL1 to overlap the first control electrode GE1 on the first gate insulating layer GIL10. In such an embodiment, the first oxide semiconductor pattern OSP1 may be provided by forming an oxide semiconductor layer on the first gate insulating layer GIL10 and patterning the oxide semiconductor layer. The patterned oxide semiconductor layer, i.e., an oxide semiconductor pattern, is crystalized. In such an embodiment, the crystallization of the oxide semiconductor pattern may be controlled by adjusting an oxygen partial pressure, process pressure, a power or a temperature, for example. In one exemplary embodiment, for example, if the oxygen partial pressure, the process pressure and the power are increased, the gran size of the oxide semiconductor pattern may be increased.

Figure 10C:
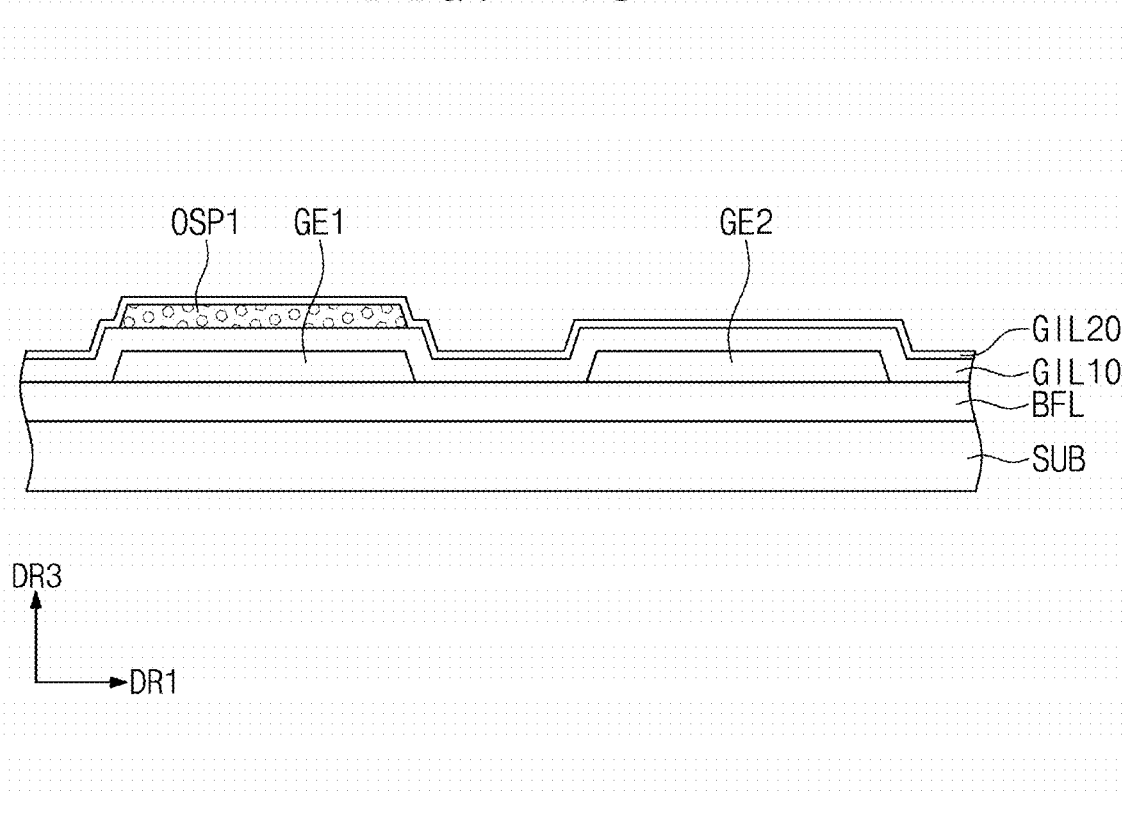

In an exemplary embodiment, as shown in FIG. 10C, the second gate insulating layer GIL20 is provided or formed on the first gate insulating layer GIL10. An inorganic material or an organic material may be deposited, coated or printed to form the second gate insulating layer GIL20.

Figure 10D:
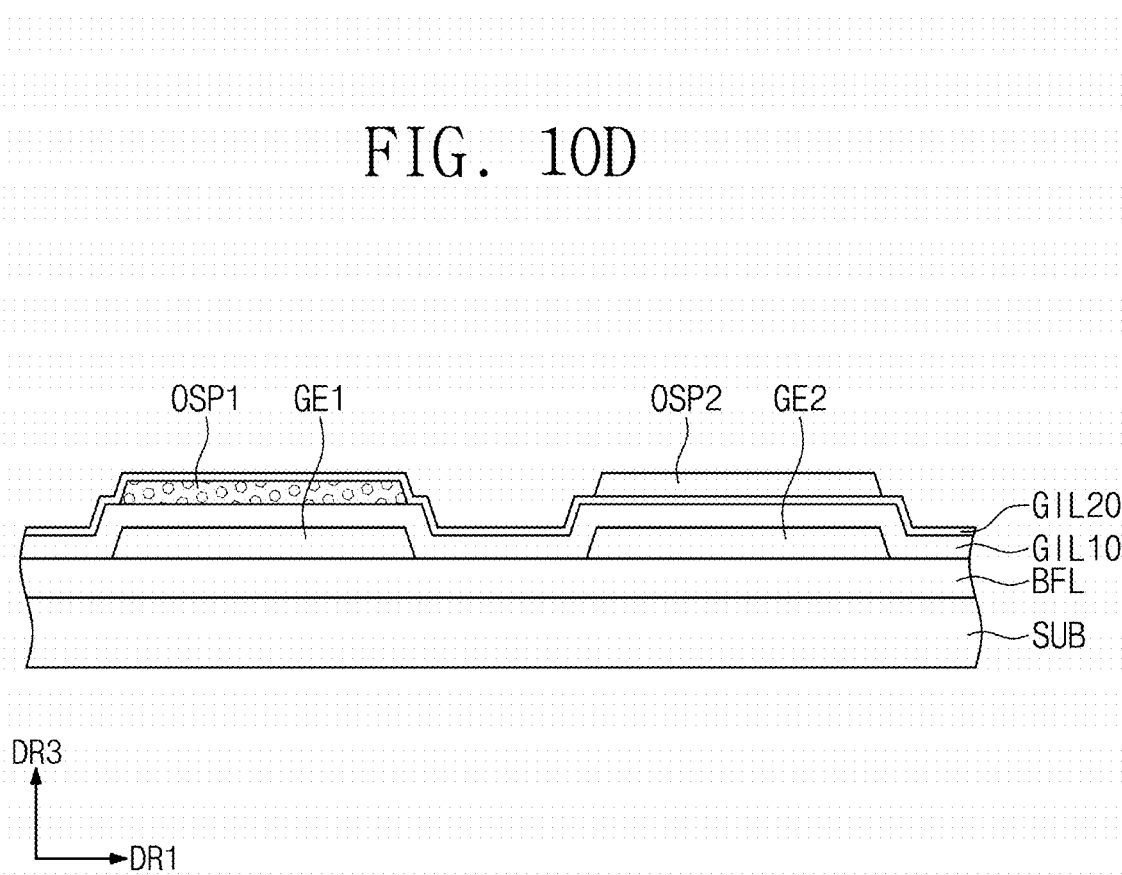

In an exemplary embodiment, as shown in FIG. 10D, the second oxide semiconductor pattern OSP2 is provided or formed on the second gate insulating layer GIL20. In such an embodiment, the second oxide semiconductor pattern OSP2 may be provided by forming an oxide semiconductor layer on the second gate insulating layer GIL20, and patterning the oxide semiconductor layer through a photolithography process.

Figure 10E:
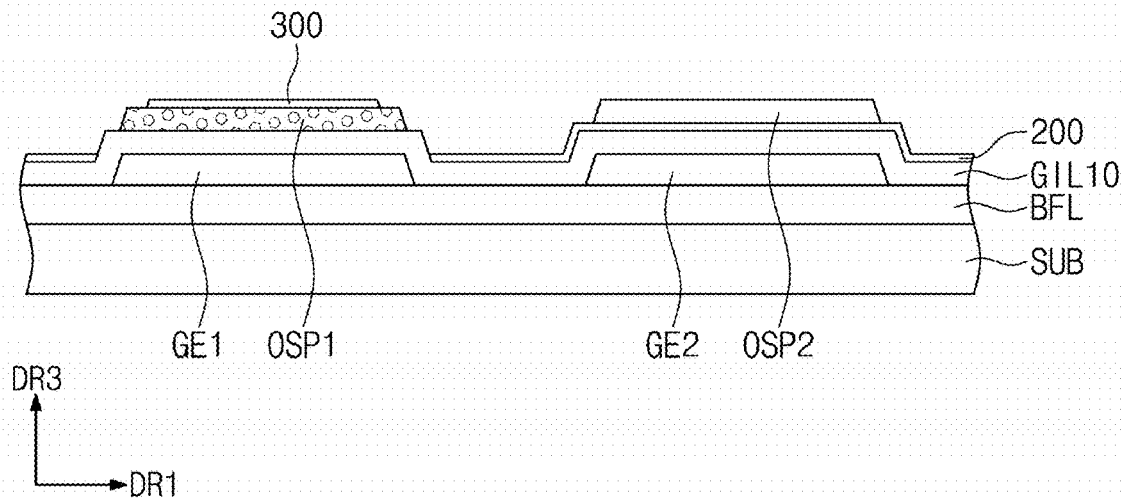

In an exemplary embodiment, as shown in FIG. 10E, the second gate insulating layer GIL20 is patterned. The second insulating layer 200 and the third insulating layer 300 are formed from the second gate insulating layer GIL20. The third insulating layer 300 overlaps the central area of the first oxide semiconductor pattern OSP1.

Figure 10F:
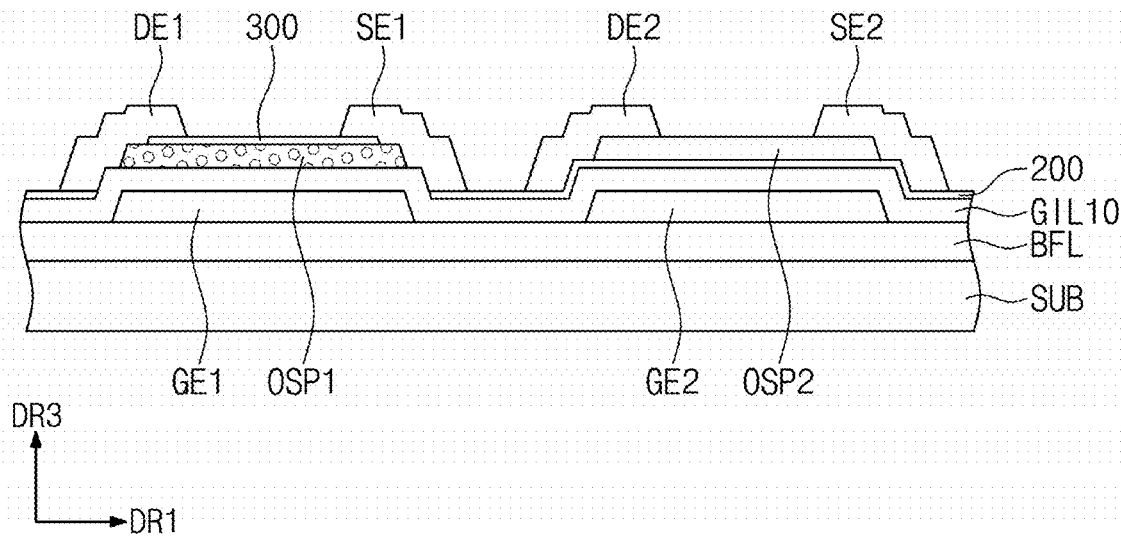

In an exemplary embodiment, as shown in FIG. 10F, the first input electrode DE1, the first output electrode SE1, the second input electrode DE2, and the second output electrode SE2 are provided or formed. In such an embodiment, the first input electrode DE1, the first output electrode SE1, the second input electrode DE2, and the second output electrode SE2 may be provided by forming a conductive layer on the patterned second gate insulating layer GIL20 through deposit, coating or printing process, and patterning the conductive layer through a photolithography process.

The first input electrode DE1 and the first output electrode SE1 are contacted with or connected to the both end portions of the first oxide semiconductor pattern OSP1, respectively. The second input electrode DE2 and the second output electrode SE2 are contacted with or connected to the both end portions of the second oxide semiconductor pattern OSP2, respectively.

Figure 10G:
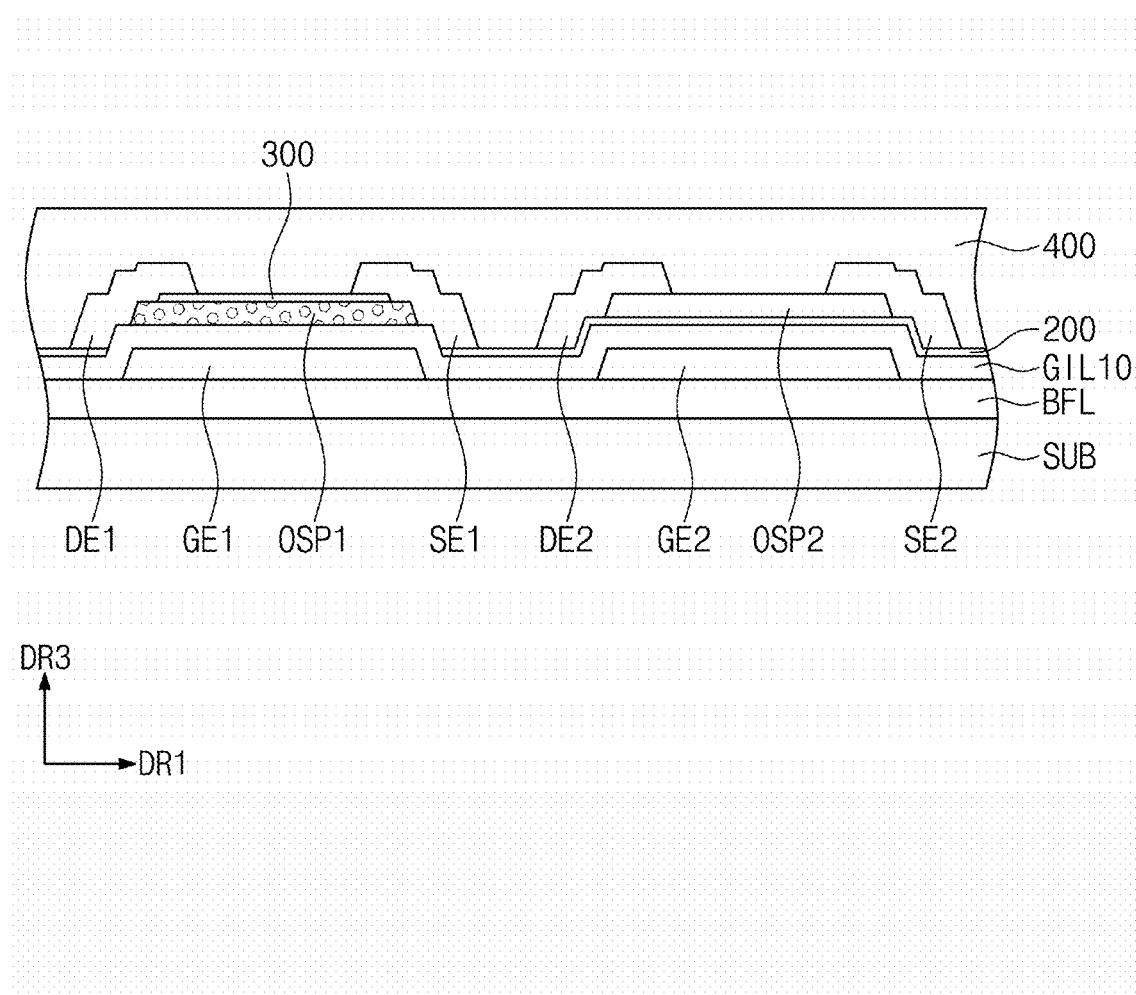

In an exemplary embodiment, as shown in FIG. 10G the fourth insulating layer 400 is provided or formed to cover the first input electrode DE1, the first output electrode SE1, the second input electrode DE2, and the second output electrode SE2. An inorganic material or an organic material may be deposited, coated or printed to form the fourth insulating layer 400. The fourth insulating layer 400 may provide the planarization upper surface, but does not limited hereto.

In an exemplary embodiment, the contact holes (not shown) may be formed in the fourth insulating layer 400 to expose the first input electrode DE1, the first output electrode SE1, the second input electrode DE2. The organic light emitting diode may be provided on the fourth insulating layer 400 to form the display panel including the semiconductor device in shown in FIG. 10G.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention as set forth in the following claims.

What is claimed is:

1. A semiconductor device comprising:
   a base substrate;
   a first thin film transistor disposed on the base substrate, wherein the first thin film transistor comprises a first input electrode, a first output electrode, a first control electrode, and a first channel of a first monolayer of a first oxide semiconductor pattern comprising a crystalline oxide semiconductor;
   a second thin film transistor disposed on the base substrate, wherein the second thin film transistor comprises a second input electrode, a second output electrode, a second control electrode, and a second channel of a second monolayer of a second oxide semiconductor pattern which comprises an oxide semiconductor having a crystal structure different from a crystal structure of the crystalline oxide semiconductor of the first oxide semiconductor pattern; and
   a plurality of insulating layers disposed on the base substrate.

2. The semiconductor device of claim 1, wherein
   the first control electrode has a voltage level lower than a voltage level of the first output electrode when the first thin film transistor is turned off,
   the second control electrode has a voltage level higher than a voltage level of the second output electrode when the second thin film transistor is turned off.

3. The semiconductor device of claim 2, further comprising:
   a scan line connected to the first control electrode;
   a data line connected to the first input electrode; and
   an organic light emitting diode electrically connected to the second output electrode.

4. The semiconductor device of claim 2, further comprising:
   a light shielding pattern disposed between the based substrate and the first control electrode.

5. The semiconductor device of claim 1, wherein the second oxide semiconductor pattern further comprises an amorphous oxide semiconductor.

6. The semiconductor device of claim 5, wherein the first and second oxide semiconductor patterns comprise an oxide of a same material.

7. The semiconductor device of claim 1, wherein
   the plurality of insulating layers comprises a first intermediate insulating layer, and a second intermediate insulating layer,
   one of the first intermediate insulating layer and the second intermediate insulating layer is disposed between the first control electrode and the first oxide semiconductor pattern and between the second control electrode and the second oxide semiconductor pattern, and
   the other of the first intermediate insulating layer and the second intermediate insulating layer is disposed either between the first control electrode and the first oxide semiconductor pattern or between the second control electrode and the second oxide semiconductor pattern.

8. The semiconductor device of claim 7, wherein each of the first and second intermediate insulating layers comprises an inorganic layer.

9. The semiconductor device of claim 7, wherein each of the first and second intermediate insulating layers comprises a silicon oxide layer.

10. The semiconductor device of claim 7, wherein a thickness of the first intermediate insulating layer is less by about 10% to about 20% than a thickness of the second intermediate insulating layer.

11. The semiconductor device of claim 10, wherein
    the first oxide semiconductor pattern is disposed between the base substrate and the first intermediate insulating layer,
    the second intermediate insulating layer is disposed on the first intermediate insulating layer, and
    the first control electrode is disposed on the second intermediate insulating layer.

12. The semiconductor device of claim 11, wherein
    the plurality of insulating layers further comprises a lower insulating layer,
    the lower insulating layer is disposed between the base substrate and the second oxide semiconductor pattern,
    the second oxide semiconductor pattern is disposed between the lower insulating layer and the second intermediate insulating layer, and
    the second control electrode is disposed on the second intermediate insulating layer.

13. The semiconductor device of claim 10, wherein
    the first control electrode is disposed between the base substrate and the first intermediate insulating layer, and
    the first oxide semiconductor pattern is disposed on the first intermediate insulating layer.

14. The semiconductor device of claim 13, wherein
    the plurality of insulating layers further comprises an upper insulating layer, and
    the upper insulating layer is disposed on the first oxide semiconductor pattern.

15. The semiconductor device of claim 13, wherein
    the second control electrode is disposed between the base substrate and the first intermediate insulating layer,
    the second intermediate insulating layer is disposed on the first intermediate insulating layer, and
    the second oxide semiconductor pattern is disposed on the second intermediate insulating layer.

16. A semiconductor device comprising:
    a base substrate;
    a first thin film transistor disposed on the base substrate, wherein the first thin film transistor comprises a first source, a first drain, a first gate, and a first channel of a first monolayer of a first oxide semiconductor pattern comprising a crystalline oxide semiconductor;
    a second thin film transistor disposed on the base substrate, wherein the second thin film transistor comprises a second source, a second drain, a second gate, and a second channel of a second monolayer of a second oxide semiconductor pattern which comprises an oxide semiconductor having a crystal structure different from a crystal structure of the crystalline oxide semiconductor of the first oxide semiconductor pattern; and
    a plurality of insulating layers disposed on the base substrate.

* * * * *